United States Patent
Hirasawa et al.

(10) Patent No.: US 9,193,531 B2
(45) Date of Patent: Nov. 24, 2015

(54) COMPONENT TRANSFER DEVICE AND METHOD

(71) Applicant: HIRATA CORPORATION, Tokyo (JP)

(72) Inventors: Yoichi Hirasawa, Tokyo (JP); Katsuyoshi Tachibana, Tokyo (JP); Soichi Tateno, Tokyo (JP); Toshihito Seki, Tokyo (JP)

(73) Assignee: HIRATA CORPORATION, Tokyo (JP)

( * ) Notice: Subject to any disclaimer, the term of this patent is extended or adjusted under 35 U.S.C. 154(b) by 239 days.

(21) Appl. No.: 14/097,533

(22) Filed: Dec. 5, 2013

(65) Prior Publication Data

US 2014/0083818 A1 Mar. 27, 2014

Related U.S. Application Data

(63) Continuation-in-part of application No. 12/674,248, filed as application No. PCT/JP2007/066351 on Aug. 23, 2007, now Pat. No. 8,696,293.

(51) Int. Cl.
*B65B 21/02* (2006.01)
*B65G 35/06* (2006.01)
(Continued)

(52) U.S. Cl.
CPC .............. *B65G 35/06* (2013.01); *B65G 1/0435* (2013.01); *B65G 49/061* (2013.01);
(Continued)

(58) Field of Classification Search
CPC ........................ H01L 21/67772; B65B 69/00
USPC ............ 414/411, 416.03, 416.07, 589, 753.1
See application file for complete search history.

(56) References Cited

U.S. PATENT DOCUMENTS

| 4,764,076 A | * | 8/1988 | Layman | ............ H01L 21/67126 |
| | | | | 414/217 |
| 5,788,448 A | * | 8/1998 | Wakamori | ........ H01L 21/67757 |
| | | | | 414/222.02 |
| 5,966,266 A | * | 10/1999 | Kato | .................... G11B 17/225 |
| | | | | 360/92.1 |

FOREIGN PATENT DOCUMENTS

| JP | 57-111703 | 7/1982 |
| JP | 6-115822 | 4/1994 |
| JP | 9-331191 | 12/1997 |
| JP | 10-12697 | 1/1998 |

(Continued)

OTHER PUBLICATIONS

International Search Report issued Sep. 18, 2007 in International Application No. PCT/JP2007/066351.

*Primary Examiner* — Ernesto Suarez
*Assistant Examiner* — Emery Hassan
(74) *Attorney, Agent, or Firm* — Wenderoth, Lind & Ponack, L.L.P.

(57) ABSTRACT

A component transfer device according to the present invention includes a holding mechanism that positions and holds a component on a carrying surface located at a predetermined height and a pull-out unit that pulls out the component held on the carrying surface by the holding mechanism in a horizontal direction. The pull-out unit includes a grasping member that can separably grasp the component from a vertical direction, a cam member that causes the grasping member to perform a component grasping operation and a component releasing operation at predetermined timings by exercising a cam function to the grasping member, a driving mechanism that drives the cam member and the grasping member, and a restraint mechanism that restrains a relative movement of the cam member with respect to the movable holder upon grasping operation.

13 Claims, 20 Drawing Sheets

(51) Int. Cl.
*B65G 49/06* (2006.01)
*B65G 1/04* (2006.01)
*H01L 21/677* (2006.01)

(52) U.S. Cl.
CPC ........... *B65G 49/064* (2013.01); *B65G 49/068* (2013.01); *H01L 21/67742* (2013.01); *H01L 21/67748* (2013.01); *B65G 2249/02* (2013.01)

(56) References Cited

FOREIGN PATENT DOCUMENTS

| | | |
|---|---|---|
| JP | 11-96633 | 4/1999 |
| JP | 2002-19959 | 1/2002 |
| JP | 4764076 B2 * | 8/2011 |

\* cited by examiner

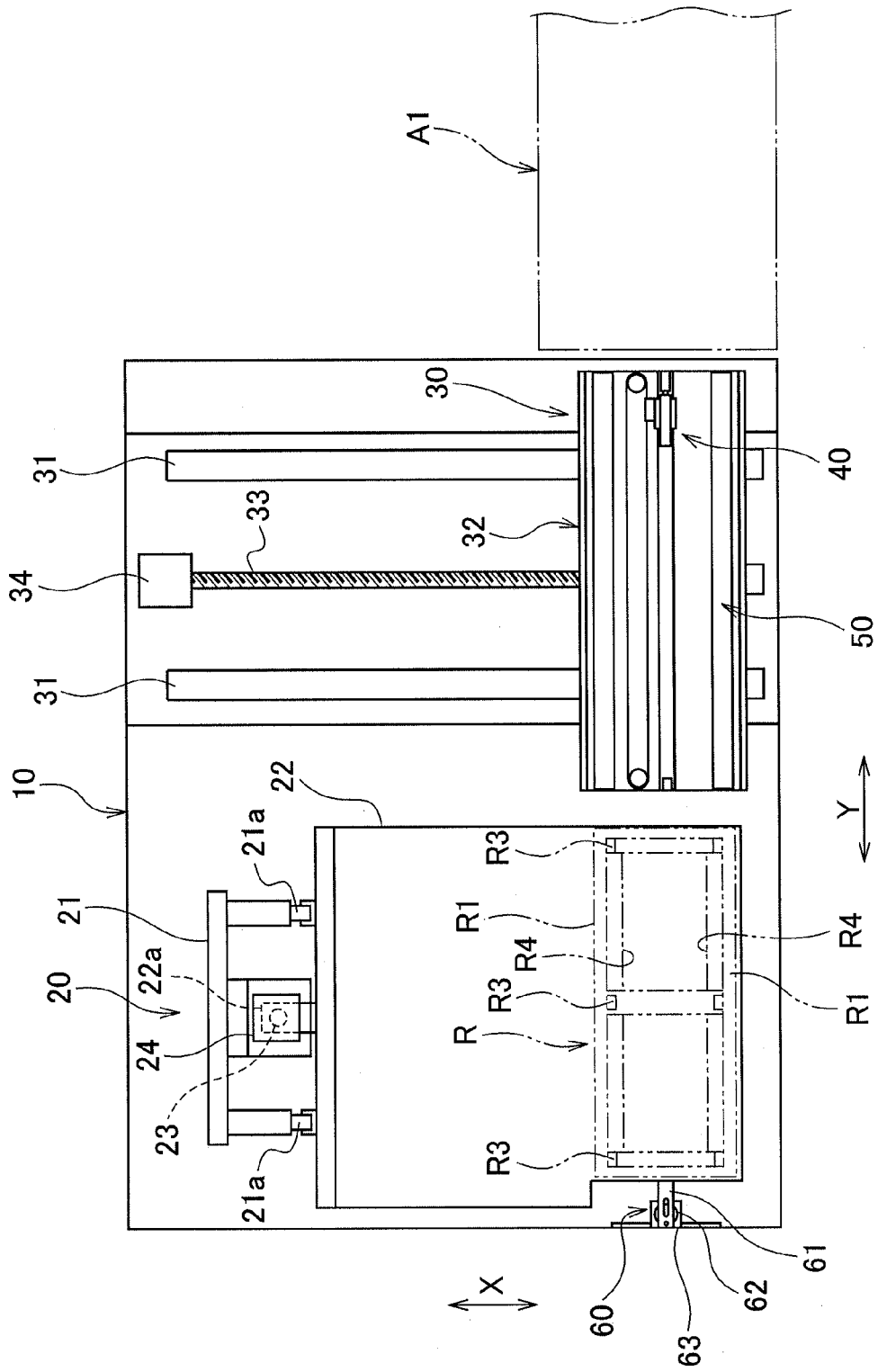

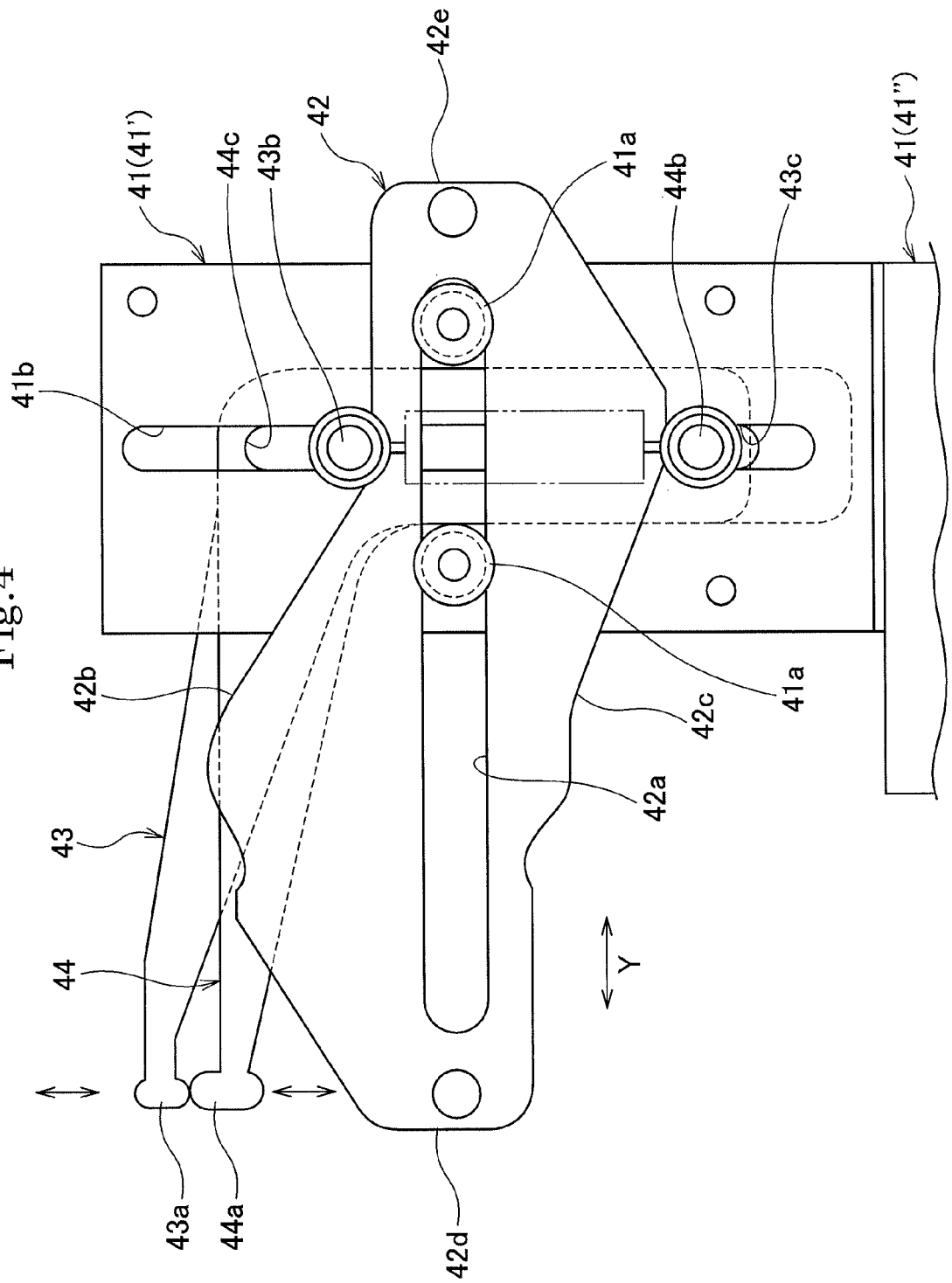

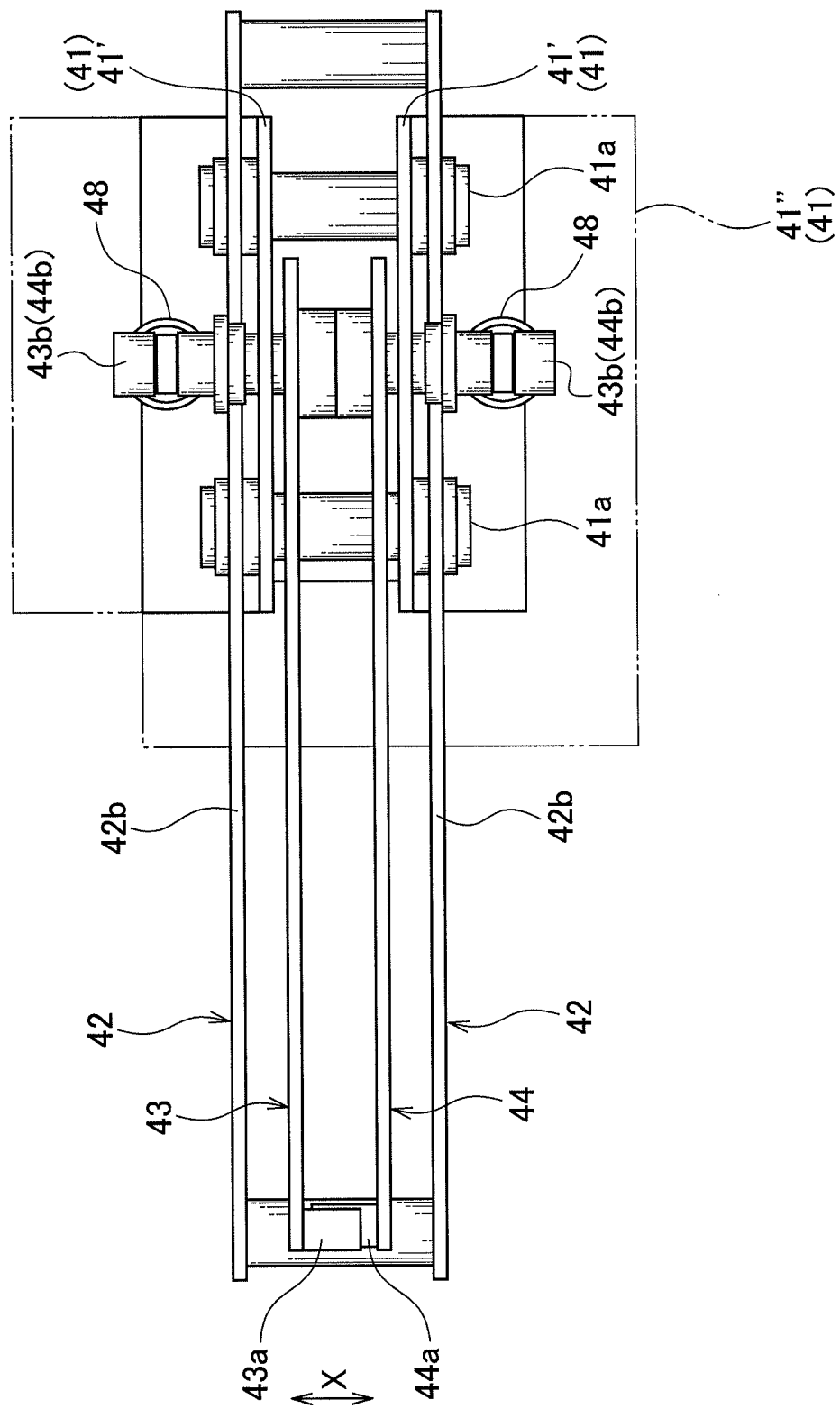

COMPONENT TRANSFER DEVICE AND METHOD

CROSS-REFERENCE TO RELATED APPLICATION

This application is a continuation-in-part of application Ser. No. 12/674,248 filed on Feb. 19, 2010, which was entered the national phase for PCT International Application No. PCT/JP2007/066351 filed Aug. 23, 2007. The application Ser. No. 12/674,248 is pending before the United States Patent and Trademark Office.

BACKGROUND OF THE INVENTION

1. Technical Field

The present invention relates to a component transfer device and method for taking out a component accommodated in a rack (or a magazine, a cassette, and the like) to be supplied to a supply area, and more particularly to a component transfer device and method for taking out a component having a plate-like shape such as a printed board, a liquid crystal substrate, a glass substrate or a thin-plate tray.

2. Description of the Related Art

As a conventional component transfer device, there is known a substrate supply device that includes a tote box moving means for horizontally and vertically moving a substrate tote box that accommodates printed substrates on a plurality of stages, a substrate fetching means for fetching the printed substrates from the substrate tote box one by one, and others, and that sets the substrate tote box at a predetermined position, moves up and down the same step by step to position each printed substrate at a predetermined fetch position, takes out the printed substrates one by one by using the substrate fetching means, and supplies them to a supply area (e.g., an implementer or an examiner) on a downstream side (see, e.g., Unexamined Japanese Patent Publication No. 9-331191).

In this device, as the substrate fetching means, there are adopted one including an arm portion that causes a protrusion to be caught on an innermost edge portion of a printed substrate from a lower side of the printed substrate and rakes out the printed substrate from the substrate tote box, one having an arm portion that sandwiches a front side of the printed substrate from the vertical direction and pulls out the printed substrate from the substrate tote box, and one including an arm portion that enters from a slit provided on a side surface of the substrate tote box on an opposite side of a fetch direction and pushes out the printed substrate from the substrate tote box.

However, when applying the arm portion that causes the protrusion to be caught on the innermost edge portion of the printed substrate and rakes out the printed substrate as the substrate fetching means in this device, the arm portion must be set to be longer than a length dimension of the substrate (the substrate tote box) in the fetch direction, a size of the device thereby increases, and a driving mechanism for moving up and down the arm portion (the protrusion) is required besides a driving mechanism that reciprocates the arm portion, resulting in complication and increase in size of the device.

Further, when applying the arm portion that operates to push out the printed substrate as the substrate fetching means, the arm portion must be set to be longer than a length dimension of the substrate (the substrate tote box) in a thrusting direction, thereby increasing a size of the device.

Furthermore, when applying the arm portion which sandwiches the front side of the printed substrate from the vertical direction and pulls out the printed substrate as the substrate fetching means, a configuration, a driving mechanism and others that allow this arm portion to perform an operation for sandwiching the printed substrate are not clear, and contents that can be specifically carried out are not disclosed.

SUMMARY OF THE INVENTION

1. Problem to be Solved by the Invention

In view of the above-described situation of the conventional arts, it is an object of the present invention to provide a component transfer device and method that can take out a component such as a substrate accommodated in, e.g., a rack to be smoothly transferred to a predetermined supply area and can improve operation efficiency and productivity while achieving simplification, miniaturization, and a reduction in cost of a configuration.

2. Means for Solving the Problem

A component transfer device according to the present invention that achieves the object includes: a holding mechanism for positioning and holding a component on a carrying surface located at a predetermined height; and a pull-out unit for pulling out the component held by the holding mechanism in a horizontal direction, wherein the pull-out unit includes a grasping member configured to separably grasp the component from an opposite direction, a cam member for exercising a cam function with respect to the grasping member to effect a grasping operation of the component and a releasing operation of the component at predetermined timings, and a driving mechanism for driving the cam member and the grasping member, the holding mechanism includes an elevation unit for moving up and down a rack that accommodates the components on a plurality of stages, the grasping member includes a first arm member having a first contact portion capable of separably coming into contact with one side surface of the component, and a second arm member having a second contact portion capable of separably coming into contact with another side surface of the component, the cam member includes a guided portion that is guided reciprocatably in a pull-out direction of the component, a first cam portion that exercises the cam function with respect to the first arm member, and a second cam portion that exercises the cam function with respect to the second arm member, the driving mechanism includes a movable holder that reciprocates in the pull-out direction, the movable holder having a horizontal guide portion for guiding the guided portion in the pull-out direction and another guide portion for guiding a first follower portion of the first arm member and a second follower portion of the second arm member in the opposite direction, and a first urging member for generating an urging force so as to make the first follower portion engage with the first cam portion and make the second follower portion engage with the second cam portion, and further comprising a restraint mechanism for restraining a relative movement of the cam member with respect to the movable holder.

According to this configuration, when the elevation unit positions and holds the component on the carrying surface located at a predetermined height, the cam member exercises a cam function based on driving by the driving mechanism in the pull-out unit, and the first arm member and the second arm member grasp (hold) the component and pull out the component to a predetermined position and then release the component at predetermined timings.

Since the pull-out unit allows the first arm member and the second arm member to effect the grasping operation and the releasing operation for the component at the predetermined timings in response to the cam function of the cam member, the configuration can be simplified, the component can be assuredly grasped and pulled out at a desired timing, and it can be smoothly transferred to the predetermined supply area as compared with an example using, e.g., a plurality of actuators, thereby improving the operation efficiency and the productivity.

Further, since the grasping member is formed of the two arm members and the relative movement of the cam member with respect to the movable holder generates the cam function, the configuration of the driving mechanism can be simplified, and the grasping operation, the pull-out operation, and the releasing operation can be accurately and smoothly carried out at predetermined timings in the mentioned order.

Furthermore, since the restraint mechanism is provided for restraining a relative movement of the cam member with respect to the movable holder, a rapid movement of the first arm member and the second arm member can be restrained upon grasping operation, whereby the first arm member and the second arm member can grasp the component slowly. Therefore, a shock upon grasping operation can be softened, in case the component is a tray and the like, and thereby preventing components put on the tray from dropping down by a shock.

The device having the above-described configuration can adopt a structure that the restraint mechanism includes a restraint follower portion separably engaging with an inverse inclined portion inversely inclined to an inclined portion corresponding a cam function range where the first arm member and the second arm member grasp the component, and a second urging member for generating an urging force so as to make the restraint follower portion engage with the inverse inclined portion.

According to this structure, since the restraint follower portion urged the second urging member engages with the inverse inclined portion (e.g., formed on the first cam portion) of the cam member when the first follower portion of the first arm member and the second follower portion of the second arm member move to the inclined portion (of the first cam portion and the second cam portion) of the cam member to start the grasping operation, a speed when the first follower portion and the second follower portion move the inclined portion is restrained, whereby the first arm member and the second arm member come closer to each other gradually to grasp the component. Therefore, a shock upon grasping operation can be softened, and the components can be grasped surely.

The device having the above-described configuration can adopt a structure that the movable holder includes a guide portion for guiding the restraint follower portion in a direction engaging with the first cam portion, and a hook portion on which a part of the second urging member is hooked.

According to this structure, since the restraint follower portion and the second urging member are installed on the movable holder, the configuration can be simplified.

The device having the above-described configuration can adopt a structure that the second urging member is an elastic member, one end of the elastic member being hooked on the restraint follower portion and another end of the elastic member being hooked on the hook portion.

According to this structure, since an elastic member is adopted as the second urging member, the second urging member can be easily disposed by hooking operation, and the configuration can be simplified.

The device having the above-described configuration can adopt a structure that the cam member exercises the cam function with respect to the grasping member to effect a retracting operation for retracting toward a lower side from the carrying surface.

According to this structure, since the grasping member is retracted from the carrying surface after the grasping member pulls out the component based on the cam function of the cam member, the component can be more smoothly transferred, and the grasping operation, the pull-out operation, the releasing operation, and the retracting operation can be assuredly performed at optimum timings in the mentioned order.

As mentioned above, since the grasping member retracts toward a lower side from the carrying surface after releasing the component, the pulled-out component can be smoothly transferred to the predetermined supply area.

The device having the above-described configuration can adopt a structure including a carrying unit that supports and carries the component pulled out by the pull-out unit.

According to this structure, the carrying unit can transfer the pulled-out component to the supply area on the downstream side at an optimum timing.

The device having the above-described configuration can adopt a structure including a push-out unit that pushes out the component positioned on the carrying surface by a predetermined distance toward the grasping member side.

According to this structure, when the components are arranged at narrow intervals on a plurality of stages, pushing out the component by a predetermined amount in advance by using the push-out unit enables the pull-out unit to assuredly grasp an end region of the pushed-out component. Furthermore, since the push-out unit pushes out the component by a predetermined amount, a long stroke in the conventional technology is no longer necessary, and simplification of the configuration and miniaturization of the device can be achieved.

Further, a component transfer device according to the present invention that achieves the object includes: a holding mechanism for positioning and holding a component on a carrying surface located at a predetermined height; and a pull-out unit for pulling out the component held by the holding mechanism in a horizontal direction, wherein the pull-out unit includes a grasping member configured to separably grasp the component from a vertical direction, a cam member for exercising a cam function with respect to the grasping member to effect a grasping operation of the component and a releasing operation of the component at predetermined timings, and a driving mechanism for driving the cam member and the grasping member, the holding mechanism includes an elevation unit for moving up and down a rack that accommodates the components on a plurality of stages in the vertical direction, the grasping member includes an upper arm member having an upper contact portion capable of separably coming into contact with an upper surface of the component, and a lower arm member having a lower contact portion capable of separably coming into contact with a lower surface of the component, the cam member includes a guided portion that is guided reciprocatably in a pull-out direction of the component, an upper cam portion that exercises the cam function of vertical movement with respect to the upper arm member, and a lower cam portion that exercises the cam function of vertical movement with respect to the lower arm member, the driving mechanism includes a movable holder that reciprocates in the pull-out direction, the movable holder having a horizontal guide portion for guiding the guided portion in a predetermined range in the pull-out direction, and a vertical guide portion for guiding an upper follower portion of the upper arm member and a lower follower portion of the second arm member in a predetermined range in the vertical direction, and a first urging member for generating an urging force so as to make the upper follower portion engage with the upper cam portion and make the lower follower portion engage with the lower cam portion, and further comprising a restraint mechanism for restraining a relative movement of the cam member with respect to the movable holder.

According to this configuration, when the elevation unit positions and holds the component on the carrying surface located at a predetermined height, the cam member exercises a cam function based on driving by the driving mechanism in the pull-out unit, and the upper arm member and the lower arm member grasp (hold) the component in the vertical direction and pull out the component to a predetermined position and then release the component at predetermined timings.

Since the pull-out unit allows the upper arm member and the lower arm member to effect the grasping operation and the releasing operation for the component at the predetermined timings in response to the cam function of the cam member, the configuration can be simplified, the component can be assuredly grasped and pulled out at a desired timing, and it can be smoothly transferred to the predetermined supply area as compared with an example using, e.g., a plurality of actuators, thereby improving the operation efficiency and the productivity.

Further, since the grasping member is formed of the upper and lower arm members and the relative movement of the cam member with respect to the movable holder generates the cam function, the configuration of the driving mechanism can be simplified, and the grasping operation, the pull-out operation, and the releasing operation can be accurately and smoothly carried out at predetermined timings in the mentioned order.

Furthermore, since the restraint mechanism is provided for restraining a relative movement of the cam member with respect to the movable holder, a rapid movement of the upper arm member and the lower arm member can be restrained upon grasping operation, whereby the upper arm member and the lower arm member can grasp the component slowly. Therefore, a shock upon grasping operation can be softened, in case the component is a tray and the like, and thereby preventing components put on the tray from dropping down by a shock.

The device having the above-described configuration can adopt a structure that the restraint mechanism includes a restraint follower portion separably engaging with an inverse inclined portion inversely inclined to an inclined portion corresponding a cam function range where the upper arm member and the lower arm member grasp the component, and a second urging member for generating an urging force so as to make the restraint follower portion engage with the inverse inclined portion.

According to this structure, since the restraint follower portion urged the second urging member engages with the inverse inclined portion (e.g., formed on the upper cam portion) of the cam member when the upper follower portion of the upper arm member and the lower follower portion of the lower arm member move to the inclined portion (of the upper cam portion and the lower cam portion) of the cam member to start the grasping operation, a speed when the upper follower portion and the lower follower portion move the inclined portion is restrained, whereby the upper arm member and the lower arm member come closer to each other gradually to grasp the component. Therefore, a shock upon grasping operation can be softened, and the components can be grasped surely.

The device having the above-described configuration can adopt a structure that the movable holder includes a vertical guide portion for guiding the restraint follower portion in a direction engaging with the first cam portion, and a hook portion on which a part of the second urging member is hooked.

According to this structure, since the restraint follower portion and the second urging member are installed on the movable holder, the configuration can be simplified.

The device having the above-described configuration can adopt a structure that the second urging member is an elastic member, one end of the elastic member being hooked on the restraint follower portion and another end of the elastic member being hooked on the hook portion.

According to this structure, since an elastic member is adopted as the second urging member, the second urging member can be easily disposed by hooking operation, and the configuration can be simplified.

The device having the above-described configuration can adopt a structure that the grasping member includes a first stopper provided at one side where the holding mechanism is arranged and restricting the movement of the cam member alone; and a second stopper provided at another side opposite to a side where the holding mechanism is arranged and restricting the movement of the cam member alone.

According to this structure, when the movable holder reaches the close position of the rack and (one side portion) of the cam member comes into contact with the first stopper to be stopped, the movable holder alone further moves, and the upper arm member (the upper contact portion) and the lower arm member (the lower contact portion) grasp the component from the vertical direction based on the cam function of the cam member. On the other hand, when the movable holder moves in an opposite direction to reach the predetermined separated position and (the other side portion of) the cam member comes into contact with the second stopper to be stopped, the movable holder alone further moves, and the upper arm member (the upper contact portion) and the lower arm member (the lower contact portion) release the component based on the cam function of the cam member.

The device having the above-described configuration can adopt a structure that the cam member includes a restricting portion for preventing the lower follower portion from departing from the lower cam portion in a state that the upper arm member and the lower arm member grasp the component.

According to this structure, when the upper arm member and the lower arm member move whiling grasping the component, the lower follower portion come into contact with the restricting portion and is restricted so as not to move downward, whereby the component can be surly grasped and transferred.

3. Advantageous Effects of the Invention

According to the component transfer device and method having the above-described configuration, simplification of the structure, miniaturization, a reduction in cost, and others can be achieved, and the component such as a substrate accommodated in, e.g., the rack can be taken out and smoothly transferred to the predetermined supply area, whereby the operation efficiency and the productivity can be improved.

BRIEF DESCRIPTION OF THE DRAWINGS

FIG. 2 is a plan view showing the component transfer device depicted in FIG. 1;

FIG. 4 is a front view showing a cam member, a grasping member (an upper arm member, a lower arm member), and a movable holder that form a part of the component transfer device depicted in FIG. 1;

FIG. 5 is a plan view showing the cam member, the grasping member (the upper arm member, the lower arm member), and the movable holder that form a part of the component transfer device depicted in FIG. 1;

EXPLANATIONS OF LETTERS OR REFERENCE NUMERALS

Figure 1:
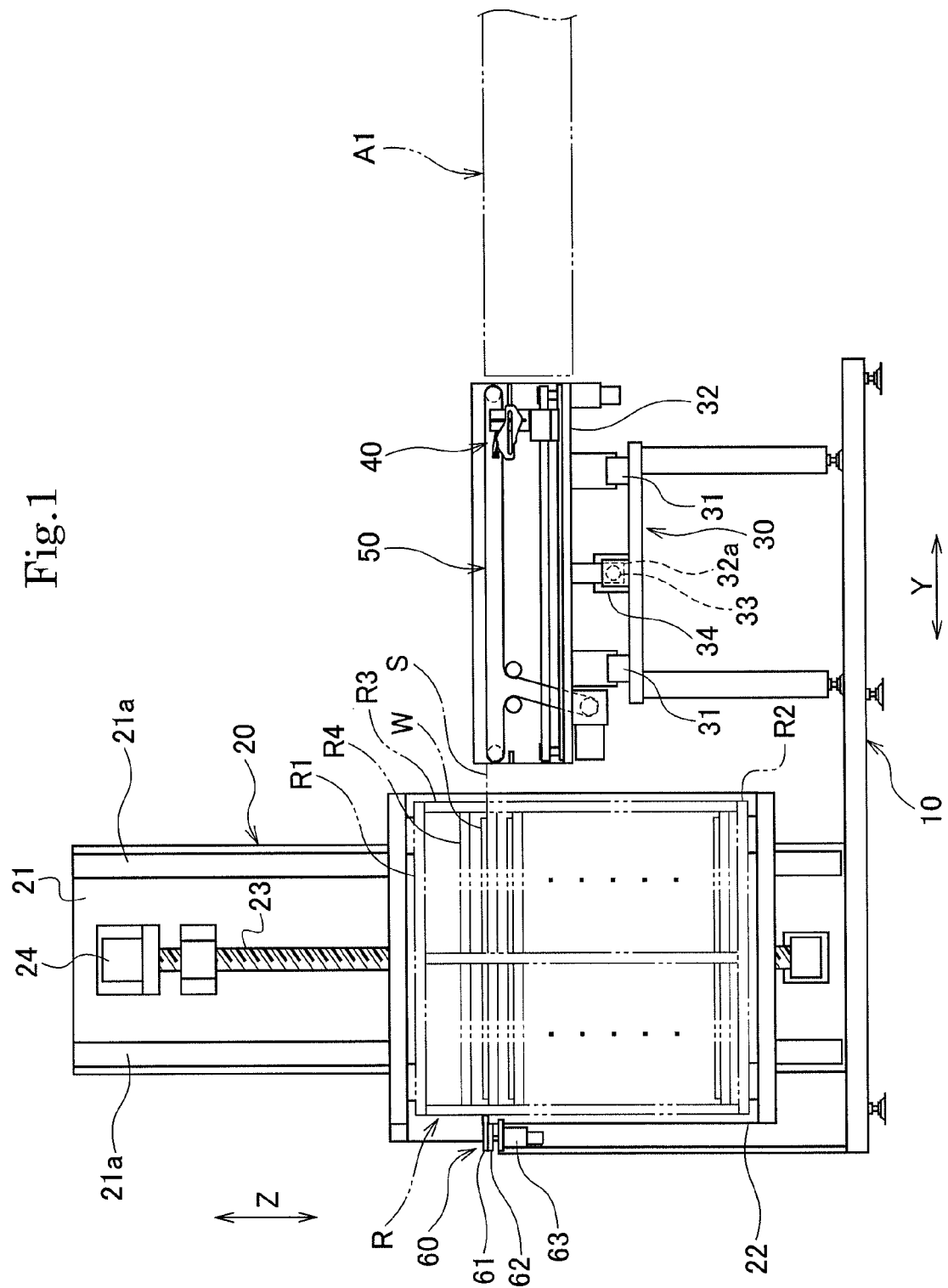
FIG. 1 is a front view showing an embodiment of a component transfer device according to the present invention.

A1 supply area
R rack
W component
Y pull-out direction
Z vertical direction
S carrying surface located a predetermined height
10 base
20 elevation unit (holding mechanism)
21 support
22 elevation table
22a ball nut
23 ball screw
24 motor
30 table unit
31 guide rail
32 movable table
32a ball nut
33 ball screw
34 motor
40 pull-out unit
41 movable holder (driving mechanism)
41' two upstanding walls
41" basal portion
41a guide pin (horizontal guide portion)
41b vertically long hole (vertical guide portion)
42 cam member
42a horizontally long hole (guided portion)
42b upper cam portion (first cam portion)
42c lower cam portion (second cam portion)
42d one side portion
42e another side portion
43 upper arm member (first arm member, grasping member)
43a upper contact portion (first contact portion)
43b upper follower pin (first follower portion, upper follower portion)
43c vertically long hole
44 lower arm member (second arm member, grasping member)
44a lower contact portion (second contact portion)
44b lower follower pin (second follower portion, lower follower portion)
44c vertically long hole
45 holder driving mechanism
45a guide rail
45b endless belt
45c driving pulley
45d driven pulley
45e motor
46 first stopper (driving mechanism)
47 second stopper (driving mechanism)
48 extension spring (first urging member)
50 carrying unit
51 carrying belt
52 driven pulley
53 driving pulley
54 motor 60 push-out unit
61 push-out rod
62 crank member
63 motor
140 pull-out unit
141 movable holder (driving mechanism)
141' two upstanding walls
141" basal portion
141a guide pin (horizontal guide portion)
141b vertically long hole (vertical guide portion)
141c vertically long hole (guide portion, vertical guide portion)
141d hook pin (hook portion)
142 cam member
142a horizontally long hole (guided portion)
142b upper cam portion (first cam portion)
142b' inclined portion
142b" inverse inclined portion
142c lower cam portion (second cam portion)
142c' inclined portion
142d one side portion
142e another side portion
142f restricting portion
143 restraint follower pin (restraint follower portion, restraint mechanism)
144 extension spring (elastic member, second urging member, restraint mechanism)
144a one end
144b another end

DETAILED DESCRIPTION OF THE INVENTION

As shown in FIGS. 1 to 3, the component transfer device includes a base 10, an elevation unit 20 as a holding mechanism that moves up and down a rack R that is provided on the left-hand side on the base 10 and accommodates components W therein, a table unit 30 provided on the right-hand side of the base 10, a pull-out unit 40 and a carrying unit 50 that are provided on the table unit 30, a push-out unit 60 that is adjacently provided on the left-hand side of the elevation unit 20 and others.

Further, as shown in FIGS. 1 and 2, a supply area A1 where the component W pulled out from the rack R is supplied is arranged at a position adjacent to the component transfer device in a Y direction.

As shown in FIGS. 1 and 2, the rack R has a substantially rectangular solid outline and includes an upper frame R1, a lower frame R2, vertical frames R3 that connect the upper frame R1 with the lower frame R2 and are provided at four corners and two positions at the center, mount frames R4 which are provided to the vertical frames R3 on a plurality of stages and on which the components W can be mounted, and others so that the substrate-like components W each having a substantially rectangular plate-like shape can be aligned and accommodated along a vertical direction Z.

As shown in FIGS. 1 and 2, the elevation unit 20 includes a support 21 vertically provided on the base 10, an elevation table 22 supported to be capable of moving up and down in the vertical direction Z with respect to guide rails 21a of the support 21, a ball screw 23 that is screwed to a ball nut 22a of the elevation table 22 and extends in a vertical direction Z, a motor 24 that drives the ball screw 23 to rotate, and others.

Further, in the elevation unit 20, when the motor 24 rotates in a state that the rack R is held on the elevation table 22, the ball screw 23 rotates, the elevation table 22 moves up and down step by step together with the ball nut 22a, and the components W to be pulled out are positioned on a carrying surface S located at a predetermined height one by one.

As shown in FIGS. 1 to 3B, the table unit 30 includes guide rails 31 that are fixed on the base 10 and extend in the X direction, a movable table 32 that is guided by the guide rails 31 and moves in the X direction, a ball screw 33 that is screwed to a ball nut 32a of the movable table 32 and extends in the X direction, a motor 34 that drives the ball screw 33 to rotate, and others.

As shown in FIGS. 1 to 3B, a pull-out unit 40 and a carrying unit 50 are provided on the movable table 32.

Furthermore, when the motor 34 rotates, the movable table 32 moves in the X direction through the ball screw 33 and the ball nut 32a to be positioned at a predetermined location.

As shown in FIGS. 3A to 9, the pull-out unit 40 includes a movable holder 41, a cam member 42, an upper arm member 43 and a lower arm member 44 as a grasping member, a holder driving mechanism 45 that drives the movable holder 41, a first stopper 46 with which one side portion of the cam member 42 can come into contact, a second stopper 47 with which the other side portion of the cam member 42 can come into contact, an extension spring 48 as a first urging member, and others.

Here, the movable holder 41, the first stopper 46, the second stopper 47, the extension spring 48, and others constitute a driving mechanism that drives the cam member 42 and the grasping member (the upper arm member 43 and the lower arm member 44).

As shown in FIGS. 4 to 7, the movable holder 41 is formed so as to define two upstanding walls 41' that stand upright at a predetermined interval in the X direction and a basal portion 41" connected to the holder driving mechanism 45, and the respective upstanding walls 41' are integrally coupled and formed so as to include two guide pins 41a as a horizontal guide portion that guides the cam member 42 to enable its reciprocation in a pull-out direction (a Y direction) of the component W, a vertically long hole 41b as a vertical guide portion that guides the upper arm member 43 and the lower arm member 44 to allow their reciprocation in the vertical direction Z, and others.

As shown in FIGS. 4 to 6 and FIG. 9, the two cam members 42 are arranged at a predetermined interval in the X direction and integrally coupled, and each cam member 42 is formed so as to include a laterally long hole 42a as a guided portion which is extended in the pull-out direction (the Y direction) of the component W and into which the guide pin 41a is inserted, an upper cam portion 42b formed at an upper edge, a lower cam portion 42c formed at a lower edge, one side portion 42d that can come into contact with the first stopper 46, the other side portion 42e that can come into contact with the second stopper 47, and others.

As shown in FIGS. 4 to 6 and FIG. 8A, the upper arm member 43 as a first arm member is formed so as to include an upper contact portion 43a as a first contact portion that can separably come into contact with an upper surface of the component W, an upper follower pin 43b as a first follower portion and an upper follower portion that engages with the upper cam portion 42b, a vertically long hole 43c into which a later-described lower follower pin 44b of the lower arm member 44 is inserted, and others.

As shown in FIGS. 4 to 6 and FIG. 8B, the lower arm member 44 as a second arm member is formed so as to include a lower contact portion 44a as a second contact portion that can separably come into contact with a lower surface of the component W, a lower follower pin 44b as a second follower portion and a lower follower portion that engages with the lower cam portion 42c, a vertically long hole 44c into which the upper follower pin 43b of the upper arm member 43 is inserted, and others.

Moreover, as shown in FIG. 4, the upper follower pin 43b is inserted into the vertically long hole 41b of the movable frame 41 and the vertically long hole 44c of the lower arm member 44 to be guided to allow its reciprocation in the vertical direction Z with respect to the movable holder 41. Additionally, as shown in FIG. 4, the lower follower pin 44b is inserted into the vertically long hole 41b of the movable frame 41 and the vertically long hole 43c of the upper arm member 43 to be guided to allow its reciprocation in the vertical direction Z with respect to the movable holder 41.

Further, an extension spring 48 is hooked on the upper follower pin 43b and the lower follower pin 44b so as to attract these pins toward each other. As a result, the upper follower pin 43b maintains a state that it is engaged with the upper cam portion 42b and receives a cam function of the vertical movement, and the lower follower pin 44b maintains a state that it is engaged with the lower cam portion 42c and receives the cam function of the vertical movement.

That is, in a relationship among the movable holder 41, the cam member 42, the upper arm member 43, and the lower arm member 44, the upper cam portion 42b and the lower cam portion 42c exercise the cam function so as to relatively vertically move the upper arm member 43 and the lower arm member 44.

Figure 9:
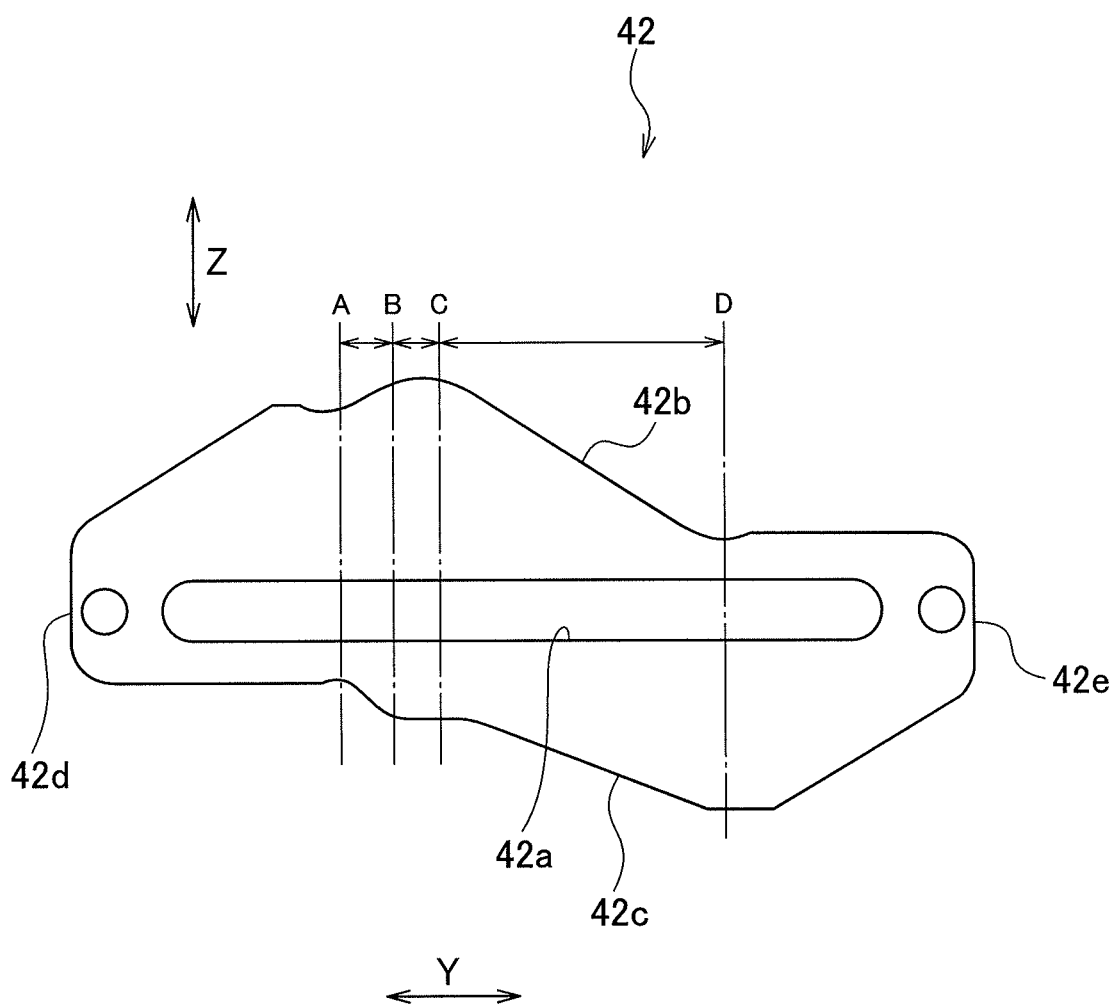
FIG. 9 is a front view showing the cam member that forms a part of the component transfer device depicted in FIG. 1.
Figure 10:
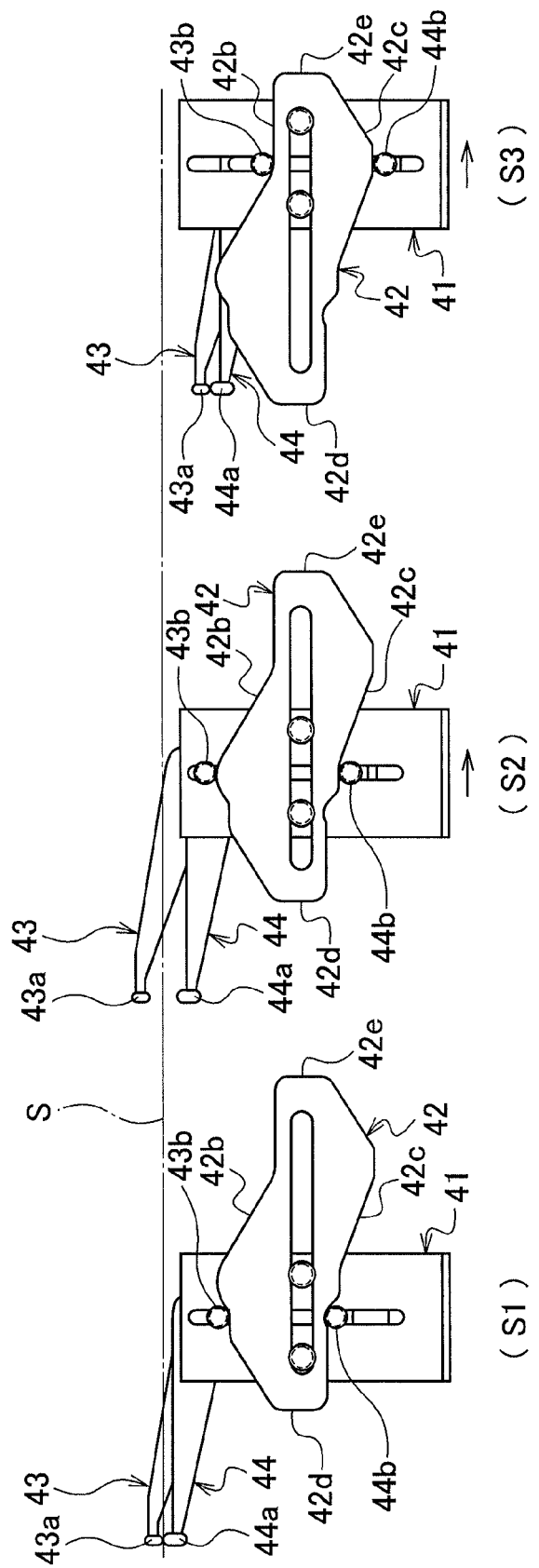
FIG. 10 is an operation view showing operations of the cam member and the grasping member (the upper arm member, the lower arm member) that form a part of the component transfer device depicted in FIG. 1.

As shown in FIGS. 9 and 10, when the upper follower pin 43b and the lower follower pin 44b move from a point A toward a point D (i.e., when the movable holder 41 moves toward the right-hand side in a state that the other side portion 42e of the cam member 42 is in contact with the second stopper 47), a grasping operation (S1 in FIG. 10) and a pull-out operation, a releasing operation (S2 in FIG. 10), and a retracting operation (S3 in FIG. 10) are continuously carried out in the mentioned order.

That is, the upper contact portion 43a and the lower contact portion 44a move closer to each other to grasp the component W from the vertical direction Z as indicated by S1 in FIG. 10 when the upper follower pin 43b and the lower follower pin 44b are placed at the point A, the upper contact portion 43a and the lower contact portion 44a move away from each other to complete an operation for canceling grasp of the component W as indicated by S2 in FIG. 10 when these pins are placed at the point B or pass through the point B, the upper contact portion 43a and the lower contact portion 44a deviate from the component W toward the front side in the pull-out direction Y when these pins are placed at the point C or pass through the point C, and an operation for retracting the upper arm member 43 and the lower arm member 44 toward the lower side from the carrying surface S is completed as indicated by S3 in FIG. 10 when these pins are placed at the point D.

On the other hand, when the upper follower pin 43b and the lower follower pin 44b move toward the point A from the point D (i.e., when the movable holder 41 moves toward the left-hand side in a state that the one side portion 42d of the cam member 42 is in contact with the first stopper 46), an operation of moving up to the height of the carrying surface S from a standby state at a retracted position, receiving an end region of the component W and grasping the component W from the vertical direction Z is completed.

Figure 3A:
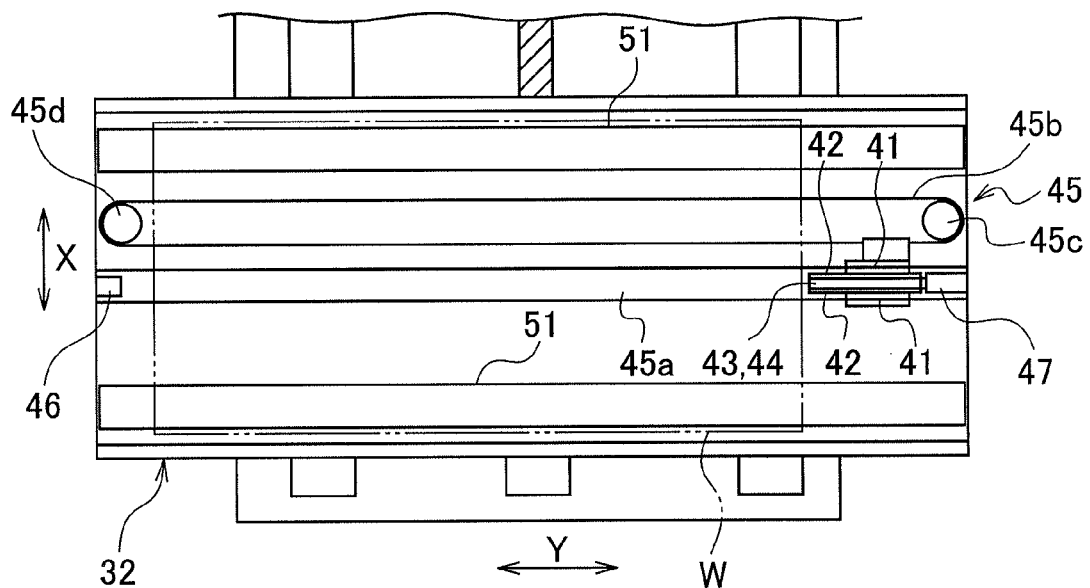
FIG. 3A is a plan view showing a pull-out unit included in the component transfer device depicted in FIG. 1.
Figure 3B:
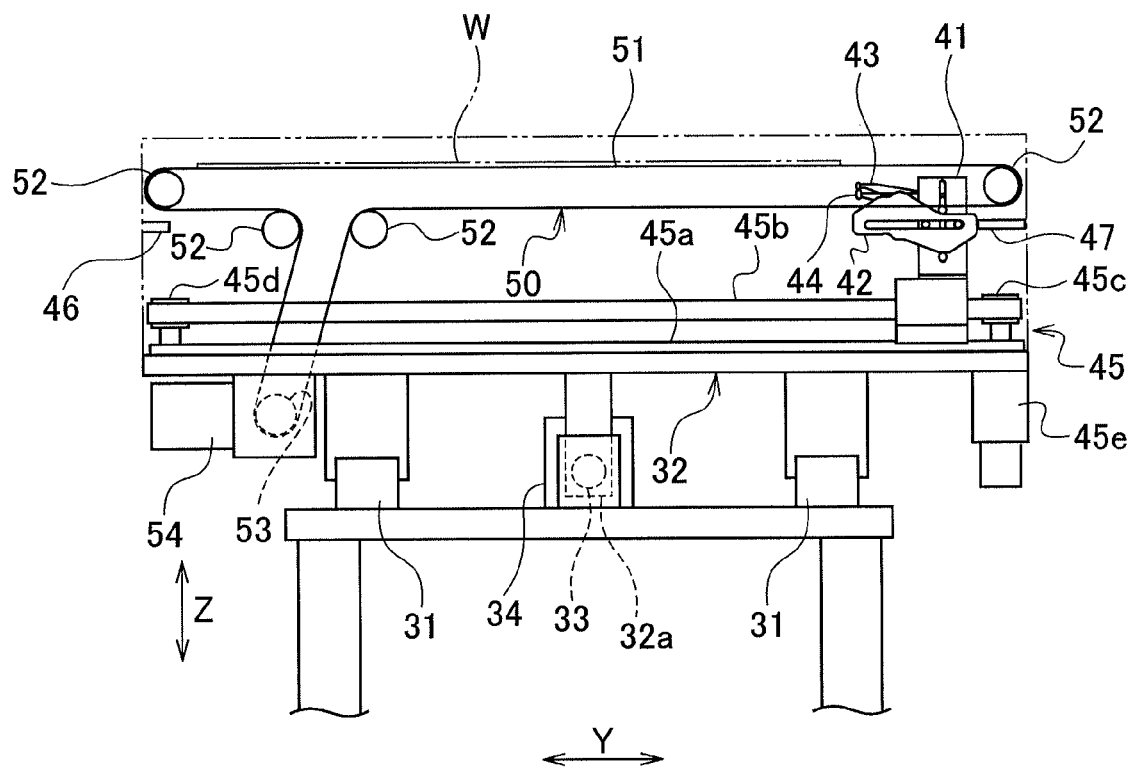
FIG. 3B is a front view showing the pull-out unit included in the component transfer device depicted in FIG. 1.
Figure 6:
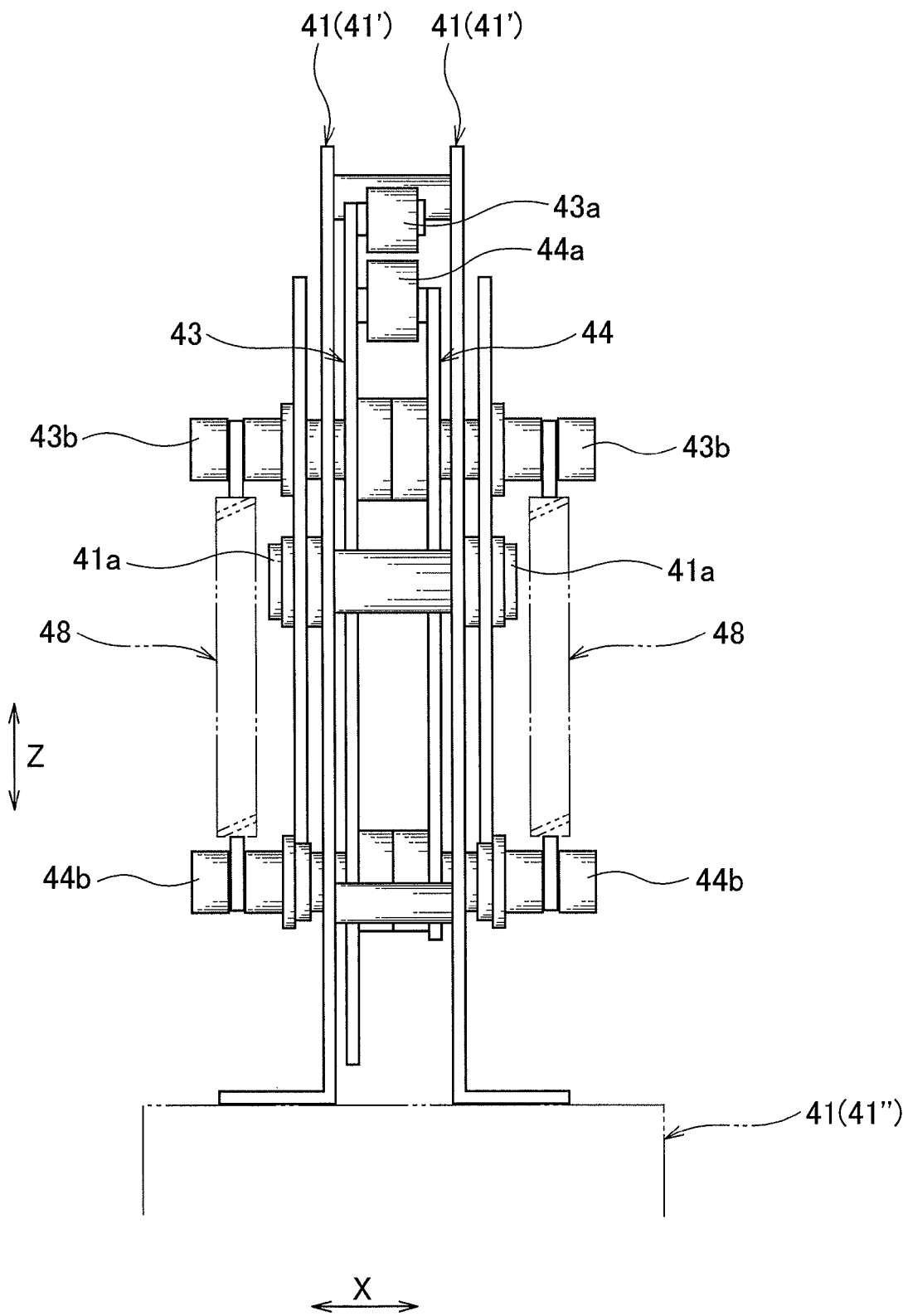
FIG. 6 is a left side view showing the cam member, the grasping member (the upper arm member, the lower arm member), and the movable holder that form a part of the component transfer device depicted in FIG. 1.
Figure 7:
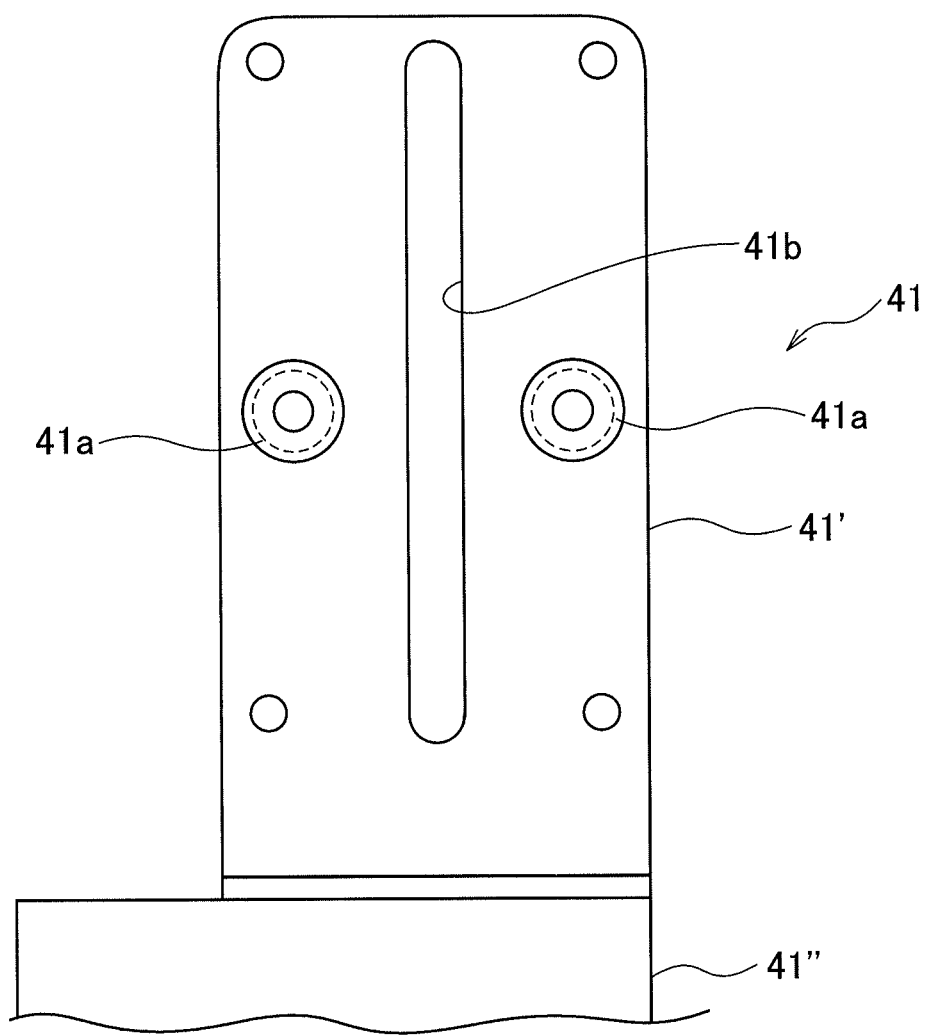
FIG. 7 is a front view showing the movable holder that forms a part of the component transfer device depicted in FIG. 1.
Figure 8A:
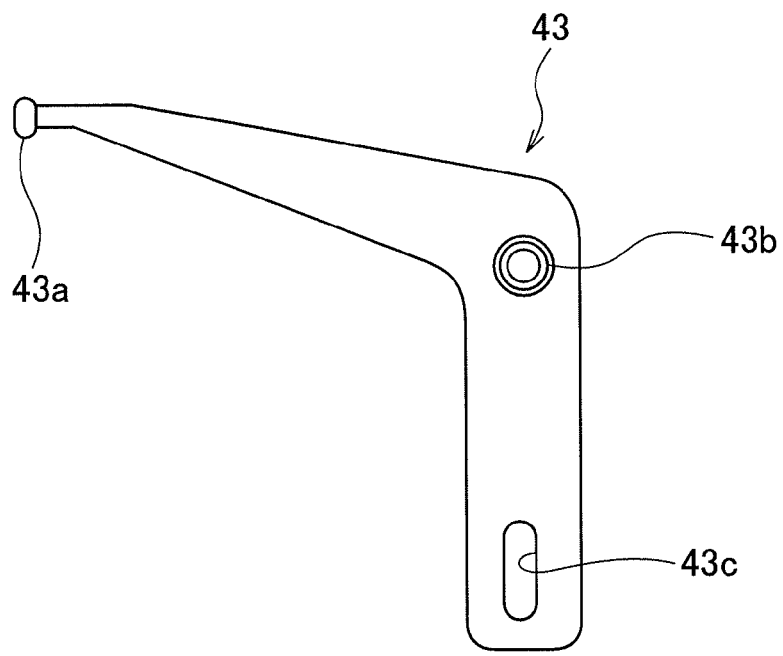
FIG. 8A is a front view showing the upper arm member that forms a part of the component transfer device depicted in FIG. 1.
Figure 8B:
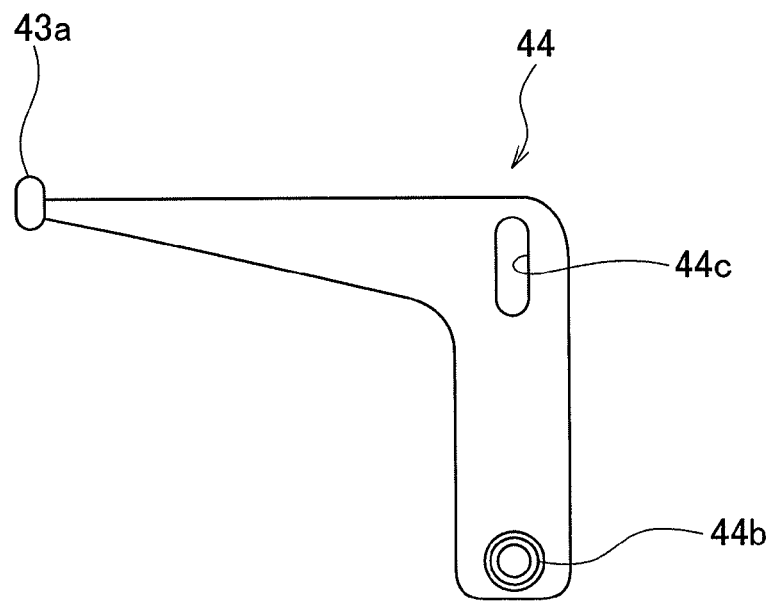
FIG. 8B is a front view showing the lower arm member that forms a part of the component transfer device depicted in FIG. 1.

As shown in FIGS. 3A and 3B, the holder driving mechanism 45 includes a guide rail 45a that is formed to extend in the pull-out direction (the Y direction) on the movable table 32 and guides the movable holder 41 to allow its reciprocation, an endless belt 45b coupled with the movable holder 41 (the basal portion 41″), a driving pulley 45c and a driven pulley 45d around which the endless belt 45b is wound, a motor 45e that drives the driving pulley 45c to rotate, and others.

Further, when the motor 45e rotates in one direction, the movable holder 41 that holds the cam members 42 and the grasping member (the upper arm member 43 and the lower arm member 44) is driven along the guide rail 45a (in the pull-out direction (the Y direction)) in the left direction along which it gets closer to the rack R. On the other hand, when the motor 45e rotates in the other direction, the movable holder 41 that holds the cam members 42 and the grasping member (the upper arm member 43 and the lower arm member 44) is driven along the guide rail 45a (in the pull-out direction (the Y direction)) in the right direction along which it gets away from the rack R.

As shown in FIGS. 3A and 3B, the first stopper 46 is arranged at a left end (a side closer to the rack R) on the movable table 32 in the pull-out direction (the Y direction).

Furthermore, when the movable holder 41 moves toward the left side in the pull-out direction (the Y direction) and reaches a predetermined close position close to the rack R, the first stopper 46 causes the one side portion 42d of the cam member 42 to come into contact therewith and restricts the movement of the cam member 42 alone so as to exercise the cam function for the grasping operation.

As shown in FIGS. 3A and 3B, the second stopper 47 is arranged at a right end (a side apart from the rack R) on the movable table 32 in the pull-out direction (the Y direction).

Moreover, when the movable holder 41 moves toward the right side in the pull-out direction (the Y direction) and reaches a predetermined separated position apart from the rack R, the second stopper 47 causes the other side portion 42e of the cam member 42 to come into contact therewith and restricts the movement of the cam member 42 alone so as to exercise the cam function for the releasing operation.

As described above, since the grasping member (the upper arm member 43 and the lower arm member 44), the cam members 42 which enables the grasping operation and the releasing operation for the component W by exercising the cam function with respect to the grasping member, and the driving mechanism (the movable holder 41, the first stopper 46, the second stopper 47, and others) are adopted as the pull-out unit 40, the component W can be assuredly grasped and pulled out at a desired timing and smoothly transferred to the supply area A1 while achieving simplification of the configuration, thereby improving the operation efficiency and the productivity.

In particular, since the two members, i.e., the upper arm members 43 and the lower arm member 44 are adopted as the grasping member, the grasping operation, the pull-out operation, and the releasing operation can be accurately and smoothly carried out at a predetermined timing in the mentioned order while simplifying the configuration of the driving mechanism.

Additionally, since the cam member 42 is an end-face cam that defines the upper cam portion 42b and the lower cam portion 42c at the upper edge and the lower edge thereof, the shape of the cam member 42 can be simplified, the upper follower pin 43b and the lower follower pin 44b are attracted toward each other by the extension spring 48 so as to engage with the upper cam portion 42b and the lower cam portion 42c, respectively, and each of the upper follower pin 43b and the lower follower pin 44b also has a function of being guided by the vertically long hole 41b of the movable holder 41, thereby obtaining the smooth and assured cam function while achieving a reduction in the number of components, simplification of the configuration, and others.

Further, an operator can release the grasping state where the upper arm member 43 and the lower arm member 44 grasp the component W by pulling up at least the upper arm member 43, whereby an efficiency of maintenance operation can be improved.

As shown in FIGS. 3A and 3B, the carrying unit 50 includes endless carrying belts 51 that can support the pulled-out component W, a plurality of driven pulleys 52 around which the carrying belts 51 are wound, a driving pulley 53, a motor 54 that drives the driving pulley 53 to rotate, and others.

Further, when the motor 54 rotates, the pulled-out component W is supported to be carried toward the supply area A1 on the downstream side.

Since the carrying unit 50 that supports and carries the component W pulled out by the pull-out unit 40 is provided in this manner, the pulled-out component W can be transferred to the supply area A1 on the downstream side at an optimum timing.

As shown in FIGS. 1 and 2, the push-out unit 60 includes a push-out rod 61 that comes into contact with an edge portion of the component W, a crank member 62 that reciprocates the push-out rod 61, a motor 63 that drives the crank member 62 to rotate, and others.

The push-out rod 61 is formed at a position on the carrying surface S so as to reciprocate by a predetermined distance in the pull-out direction (the Y direction).

Furthermore, when the motor 63 rotates and the crank member 62 thereby rotates a predetermined angle, the push-out rod 61 enters the rack R to push the component W positioned on the carrying surface S by a predetermined distance toward the grasping member (the upper arm member 43 and the lower arm member 44) or the carrying unit 50 from the rack R.

Since the push-out unit 60 pushes out the component W by the predetermined distance in advance in this manner, the pull-out unit 40 can assuredly grasp the end region of the pushed component W even though the components W are aligned at small intervals on the plurality of stages. Moreover, since the push-out unit 60 pushes out the component W by the predetermined distance, a long stroke like that in the conventional examples is no longer necessary, thereby achieving simplification of the configuration and a reduction in size of the device.

An operation (a transfer method) of the component transfer device will now be described with reference to FIGS. 11 to 16.

Figure 11:
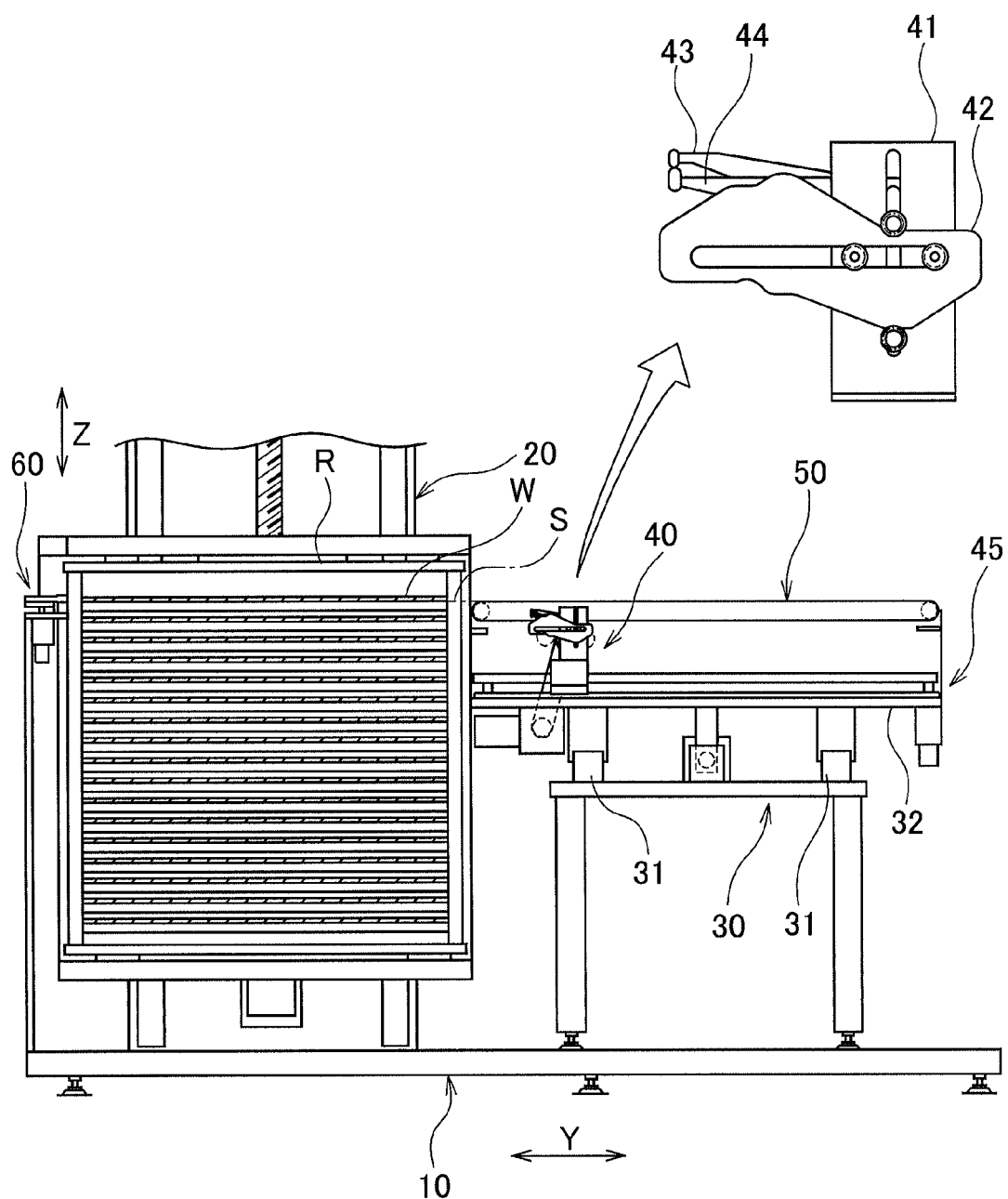
FIG. 11 is an operation view showing an operation for positioning the component on a carrying surface located a predetermined height in the component transfer device according to the present invention.

First, as shown in FIG. 11, when the rack R accommodating the components W on the plurality of stages is carried into and held by the elevation unit 20, the elevation unit 20 moves up and down to position the component W that is to be taken out first on the carrying surface S located at a predetermine height (a holding step, an elevation step). At this moment, the pull-out unit 40 is stopped at a position retracted to the lower side from the carrying surface S in a state that the upper contact portion 43a of the upper arm member 43 and the lower contact portion 44a of the lower arm member 44 are closer to each other.

Figure 12:
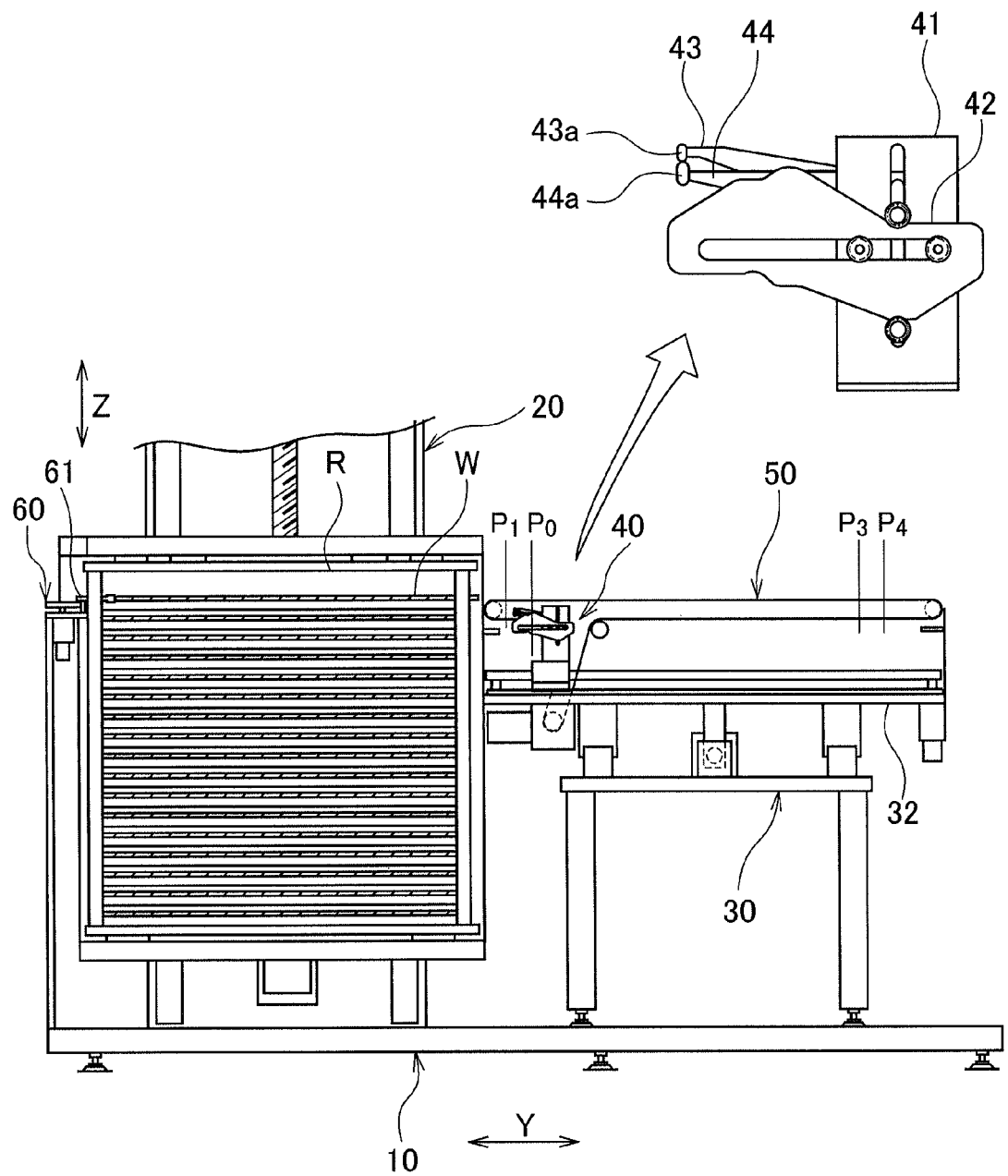
FIG. 12 is an operation view showing operations of a push-out unit and a pull-out unit in the component transfer device according to the present invention.

Subsequently, when the component W positioned on the carrying surface S is detected by, e.g., a sensor (not shown), the push-out unit 60 operates to push out this component W by the predetermined distance toward the right-hand side from the rack R (a push-out step) as shown in FIG. 12. Additionally, the movable holder 41 moves in the left-hand side in the pull-out direction (the Y direction) to reach a standby position $P_0$. Here, when the pull-out unit 40 and the carrying unit 50 deviate from a predetermined position in the X direction, the movable table 31 is appropriately driven in the X direction, thereby correcting this displacement.

Figure 13:
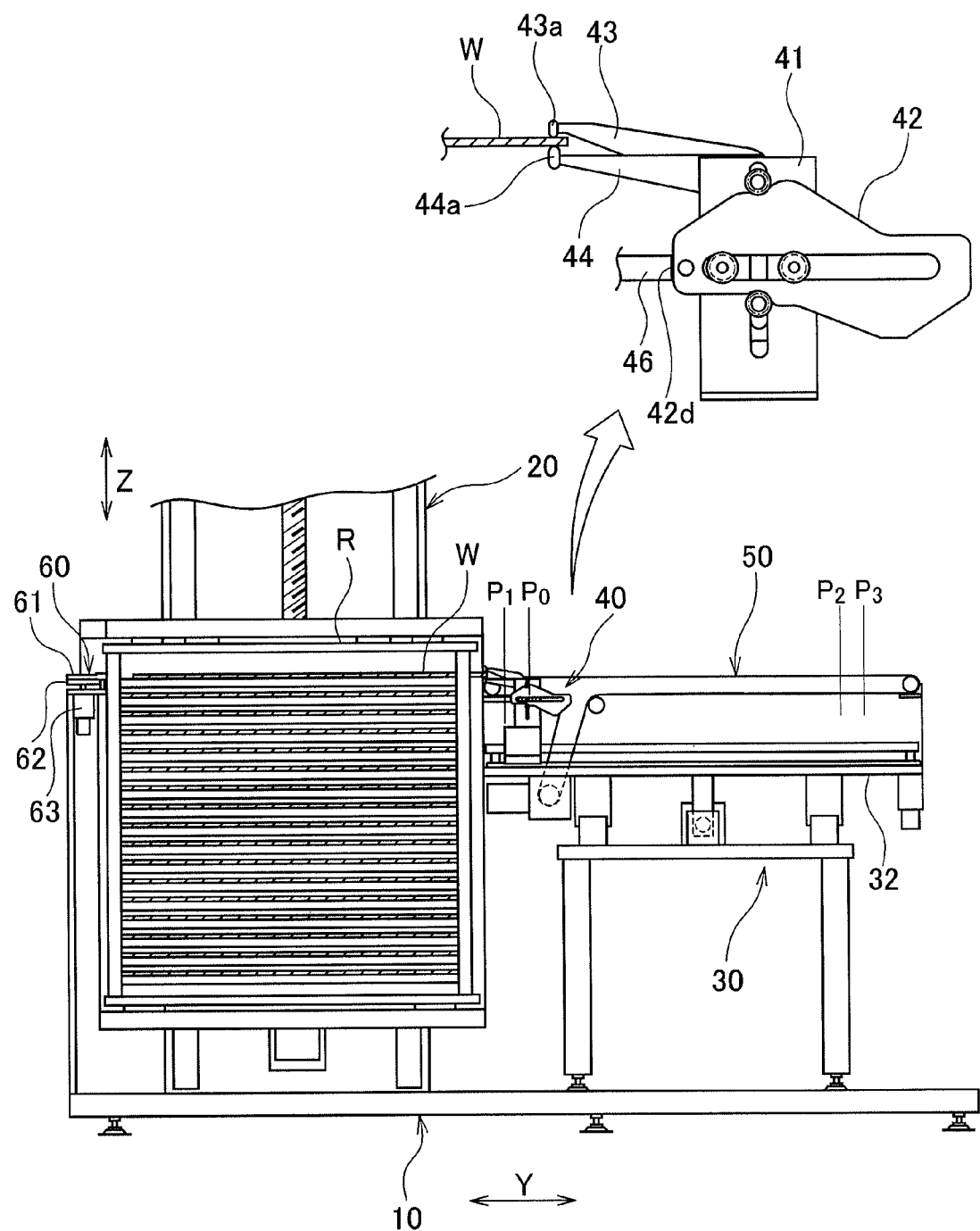
FIG. 13 is an operation view showing an operation for grasping the component by the pull-out unit in the component transfer device according to the present invention.

Subsequently, as shown in FIG. 13, when the push-out operation for the component W performed by the push-out unit 60 is completed, the push-out unit 60 (the push-out rod 61) returns to the standby position. Further, when the movable holder 41 moves toward the left-hand side to reach the close position close to the rack R, the one side portion 42d of the cam member 42 comes into contact with the first stopper 46 to restrict the movement of the cam member 42 toward the left-hand side, and (the upper contact portion 43a of) the upper arm member 43 and (the lower contact portion 44a of) the lower arm member 44 move up a predetermined distance to position (the upper contact portion 43a of) the upper arm member 43 above the carrying surface S and position (the lower contact portion 44a of) the lower arm member 44 below the carrying surface S while the movable holder 41 further moves by a predetermined distance toward the left-hand side to reach a grasping position $P_1$, thereby positioning the component W between the upper contact portion 43a and the lower contact portion 44a while maintaining a state that the upper contact portion 43a is apart from the lower contact portion 44a. And the upper contact portion 43a and the lower contact portion 44a come closer from the vertical direction Z of the component W to grasp the end region of the component W.

Figure 14:
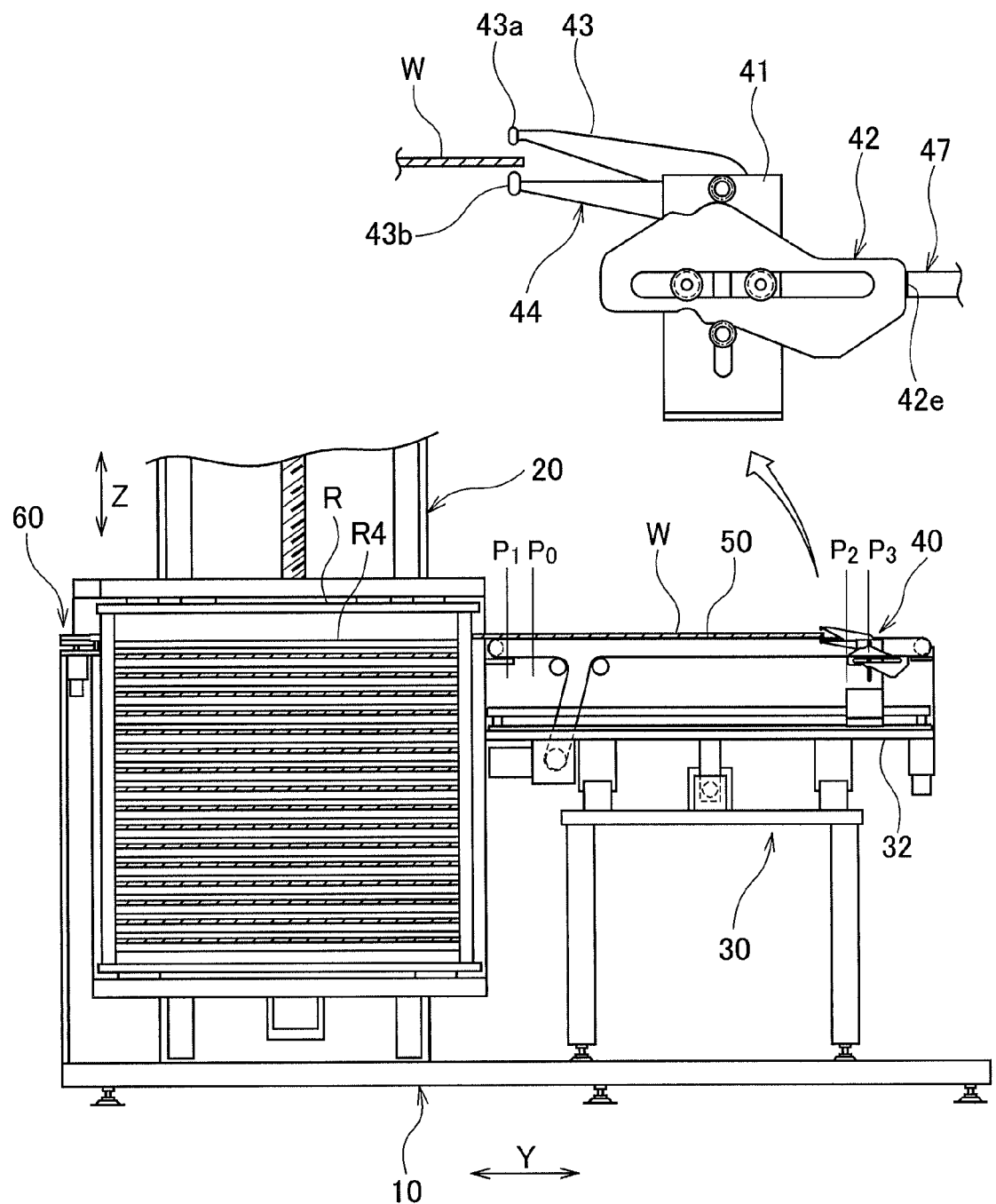
FIG. 14 is an operation view showing an operation for releasing the component after pulling out the component to a predetermined position by the pull-out unit in the component transfer device according to the present invention.

Subsequently, when the movable holder 41 moves toward the right-hand side in the pull-out direction (the Y direction) to reach a separated position apart from the rack R as shown in FIG. 14 in a state that the upper arm member 43 and the lower arm member 44 grasp the component W, the other side portion 42e of the cam member 42 comes into contact with the second stopper 47 to restrict the rightward movement of the cam member 42, and (the upper contact portion 43a of) the upper arm member 43 and (the lower contact portion 44a of) the lower arm member 44 move away from the component W in the vertical direction Z to release the component W while the movable holder 41 further moves rightward by a predetermined distance to reach a release position $P_2$ (the pull-out step).

Figure 15:
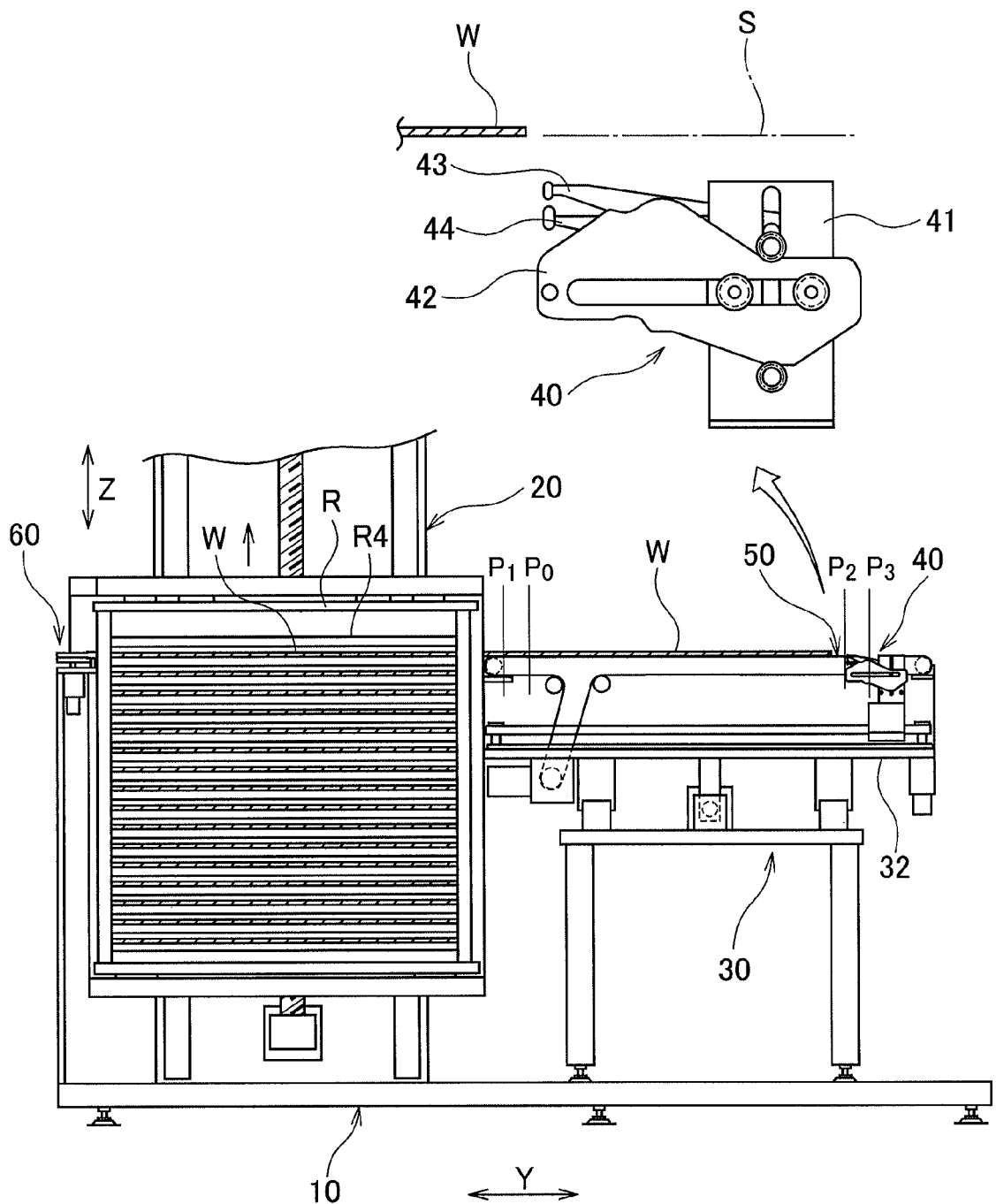
FIG. 15 is an operation view showing an operation for retracting the pull-out unit to the lower side from the carrying surface after releasing the component in the component transfer device according to the present invention.

Subsequently, as shown in FIG. 15, based on the cam function of the cam member 42, the upper arm member 43 and the lower arm member 44 move down by a predetermined distance from the carrying surface S while the movable holder 41 further moves rightward to reach a retracted position $P_3$, thereby completing a retracting operation. Furthermore, the elevation unit 20 moves up one step to position the next component W on the carrying surface S located at the predetermined height.

As described above, since the upper arm member 43 and the lower arm member 44 pull out the component W and then the upper arm member 43 and the lower arm member 44 are retracted to the lower side from the carrying surface S based on the cam function of the cam member 42, the component W can be more smoothly transferred, and the grasping operation, the pull-out operation, the releasing operation, and the retracting operation can be assuredly performed at optimum timings in the mentioned order.

Figure 16:
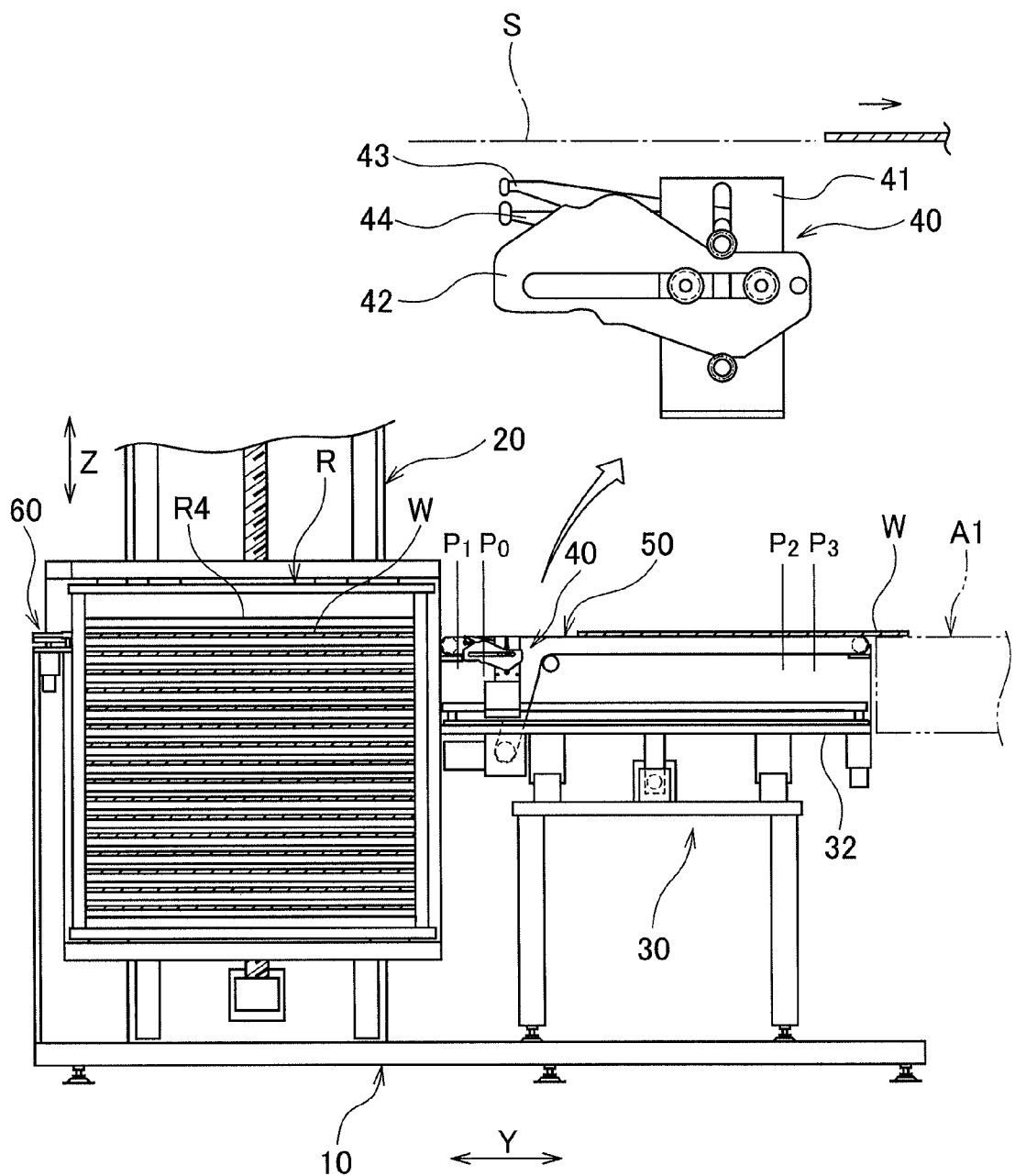
FIG. 16 is an operation view showing an operation for carrying the component toward a downstream side by a carrying unit and an operation for positioning the next component on the carrying surface in the component transfer device according to the present invention.

Then, as shown in FIG. 16, the pulled-out component W is supported by the carrying unit 50 and then carried to the supply area A1 (the carrying step). Alternatively, the pulled-out component W is supported on the carrying unit 50 and then carried to a predetermined receiving position in the supply area A1 by the carrying unit 50. Here, the carrying operation of the carrying unit 50 is performed at a desired optimum timing.

Further, the movable holder 41 moves leftward to reach the standby position P₀ during carriage of the component W performed by the carrying unit 50.

A series of operations including the elevation step (the elevating operation and the positioning operation), the push-out step (the push-out operation), the pull-out step (the grasping operation, the pull-out operation, the release operation, and the retracting operation), the carrying step (the carrying operation), and others are repeatedly carried out with respect to all the components W in the mentioned order.

As described above, according to the component transfer device and method, the component W such as a substrate accommodated in, e.g., the rack R can be taken out and smoothly transferred to the predetermined supply area A1 while achieving simplification of the configuration, miniaturization, a reduction in cost, and others, thereby improving the operation efficiency and the productivity as a whole.

FIGS. 17 to 20 are to show an improved embodiment of a component transfer device according to the present invention. In the pull-out unit, the movable holder and the cam member are improved and a restraint mechanism is added. The others are the same as the above-mentioned embodiment and therefore, same configurations are made with same letters or reference numerals and an explanation thereof is omitted.

Figure 17:
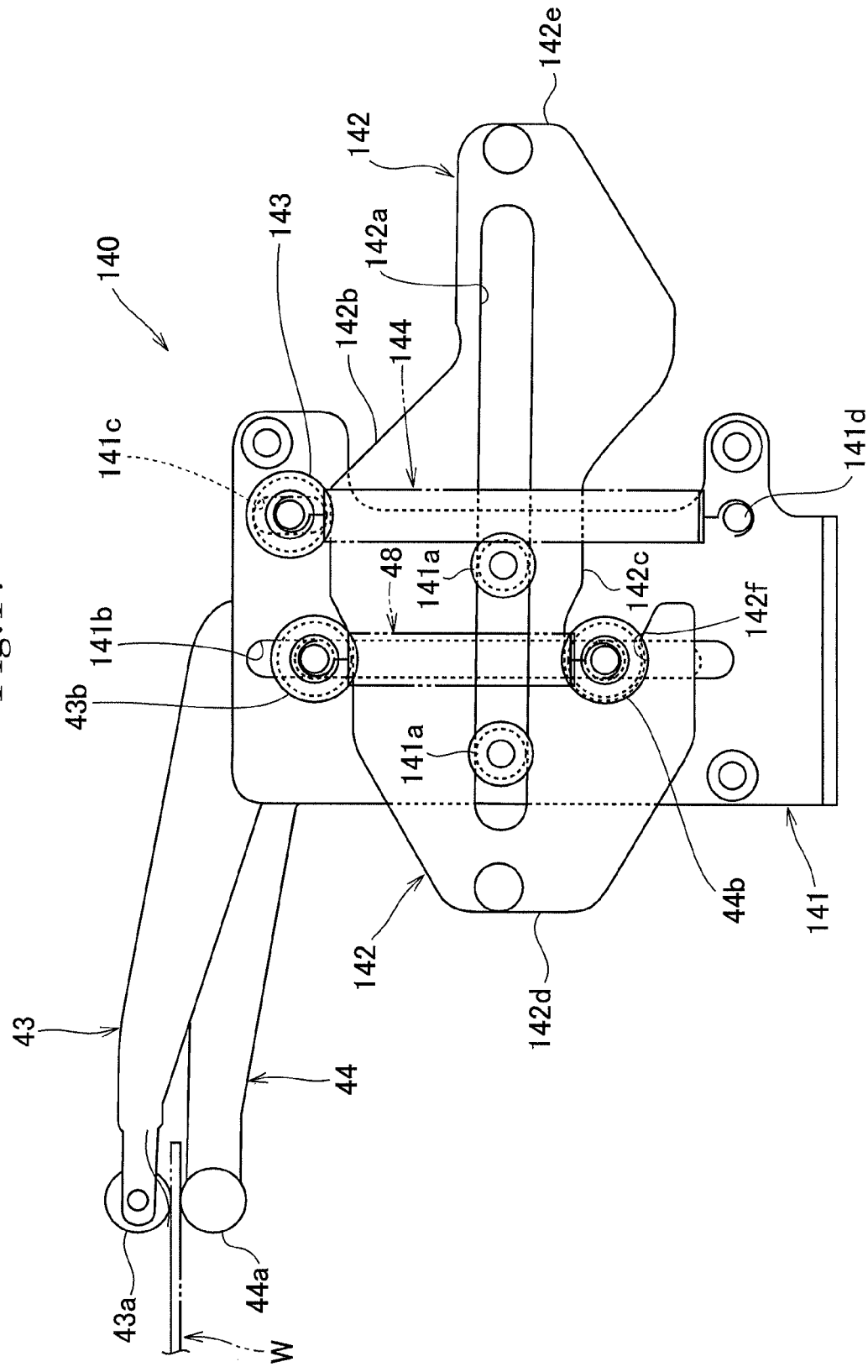
FIG. 17 is a front view showing the movable holder, the cam member, and an added restraint mechanism in an improved embodiment of a pull-out unit that forms a part of a component transfer device according to the present invention.

In the embodiment, the pull-out unit 410 includes, as shown in FIG. 17, a movable holder 141, a cam member 142, a restraint follower pin 143 as a restraint follower portion, an extension spring 144 as a second urging member and an elastic member, the upper arm member 43 and the lower arm member 44, the holder driving mechanism 45 that drives the movable holder 141 (see FIGS. 3A and 3B), the first stopper 46 with which one side portion 142d of the cam member 142 can come into contact (see FIGS. 3A and 3B), the second stopper 47 with which the other side portion 142e of the cam member 142 can come into contact, the extension spring 48 as a first urging member, and others.

Here, the movable holder 141, the first stopper 46, the second stopper 47, the extension spring 48, and others constitute a driving mechanism that drives the cam member 142 and the grasping member (the upper arm member 43 and the lower arm member 44).

Further, the restraint follower pin 143 and the extension spring 144 constitute a restraint mechanism for restraining a relative movement of the cam member 142 with respect to the movable holder 141 when the upper arm member 43 and the lower arm member 44 grasp the component W by the cam function of the cam member 142.

Figure 18:
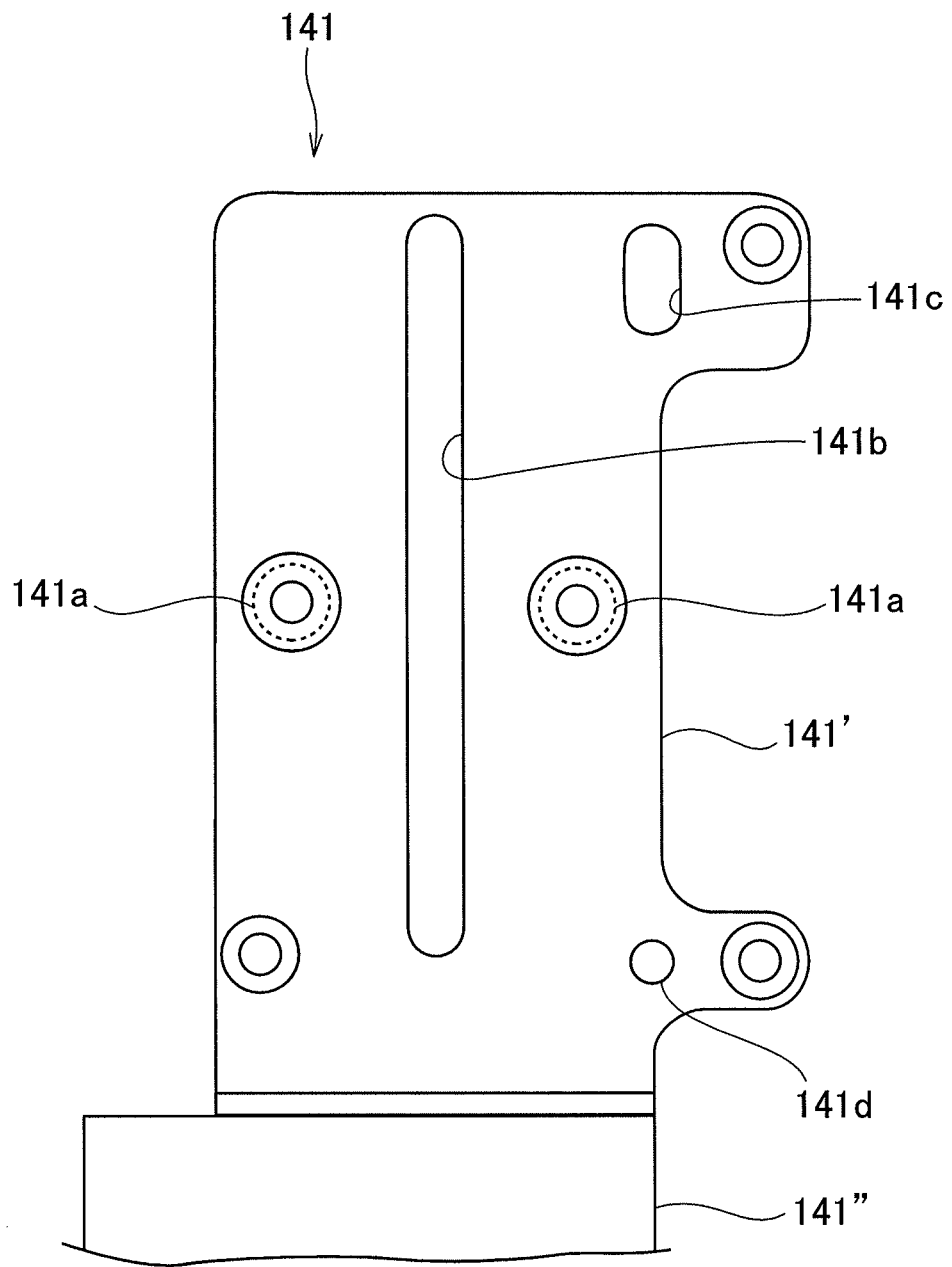
FIG. 18 is a front view showing the movable holder included in the pull-out unit that forms a part of the component transfer device depicted in FIG. 17.

As shown in FIGS. 17 and 18, the movable holder 141 is formed so as to define two upstanding walls 141' (one side only is illustrated) that stand upright at a predetermined interval in the X direction and a basal portion 141" connected to the holder driving mechanism 45, and the respective upstanding walls 141' are integrally coupled and formed so as to include two guide pins 141a, 141a as a horizontal guide portion that guides the cam member 142 to enable its reciprocation in a pull-out direction (a Y direction) of the component W, a vertically long hole 141b as a vertical guide portion that guides the upper arm member 43 and the lower arm member 44 to allow their reciprocation in the vertical direction Z, a vertically long hole 141c as a guide portion and a vertical guide portion that guides the restraint follower pin 143 to allow its reciprocation in the vertical direction Z, a hook pin 141d as a hook portion on which another end 144b of the tension spring 144 is hooked, and others.

Figure 19:
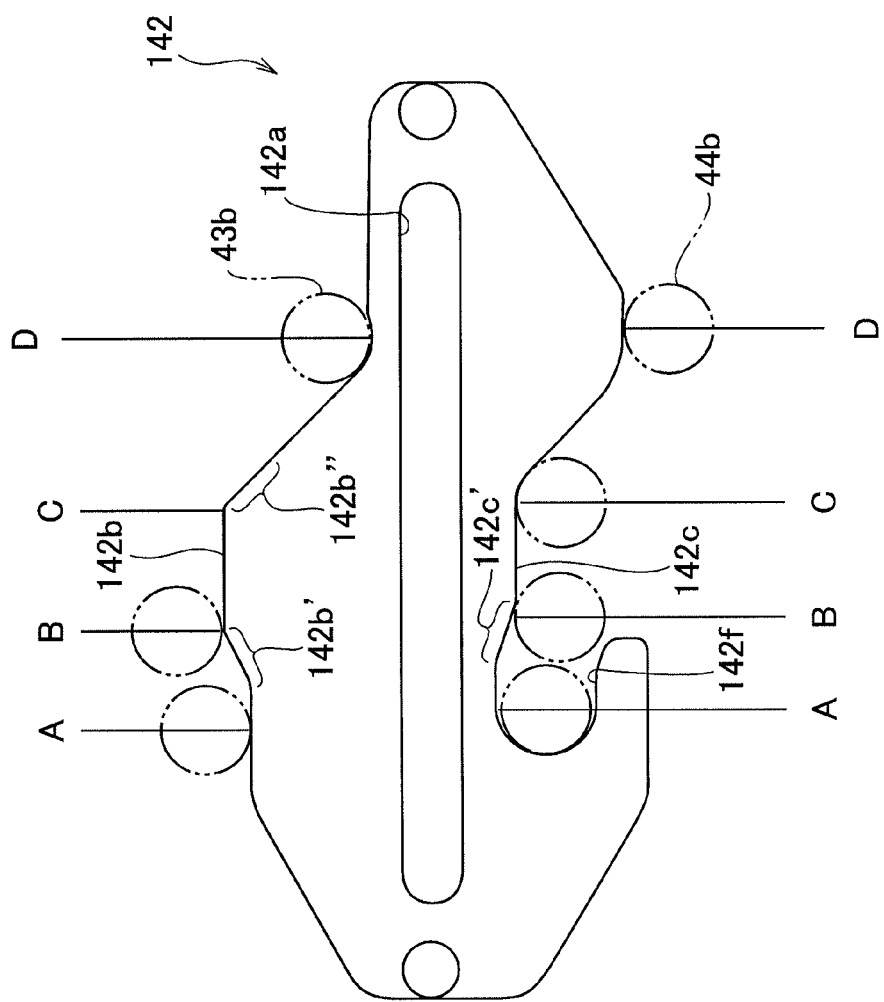
FIG. 19 is a front view showing the cam member included in the pull-out unit that forms a part of the component transfer device depicted in FIG. 17.

As shown in FIGS. 17 and 19, the two cam members 42 (one side only is illustrated) are arranged at a predetermined interval in the X direction and integrally coupled (like the embodiment shown in FIG. 6), and each cam member 142 is formed so as to include a laterally long hole 142a as a guided portion which is extended in the pull-out direction (the Y direction) of the component W and into which the guide pins 141a, 141a are inserted, an upper cam portion 142b formed at an upper edge, a lower cam portion 142c formed at a lower edge, one side portion 142d that can come into contact with the first stopper 46, the other side portion 142e that can come into contact with the second stopper 47, a restricting portion 142f with which the lower follower pin 44b separably engages, and others.

As shown in FIG. 19, in the upper cam portion 142b and the lower cam portion 142c, a region between the point A to the point B corresponds to a grasping operation, a region between the pint B to the point C corresponds to a releasing operation, a region between the point C to the point D corresponds to a retracting operation, and the upper cam portion 142b and the lower cam portion 142c exercise a cam function for a grasping operation when the upper and lower follower pins 43b and 44b shift from the point B to the point A.

Here, the upper cam portion 142b and the lower cam portion 142c include inclined portions 142b' and 142c' in a transition region (in a grasping process) from the point B to the point A. Further, the upper cam portion 142b includes an inverse inclined portion 142b" inversely inclined to the inclined portion 142b' in a transition region from the point D to the point C.

As shown in FIG. 17, when the upper arm member 43 and the lower arm member 44 move whiling grasping the component W, the restricting portion 142f engages with the lower follower pin 44b to prevent the lower follower pin 44b from moving downward.

Therefore, the lower arm member 44 is prevented from moving downward by the weight of the component W, whereby the component W can be surly grasped and transferred.

With respect to the relationship among the movable holder 141, the cam member 142, the upper arm member 43 and the lower arm member 44, the upper follower pin 43b of the upper arm member 43 is, as shown in FIG. 17, inserted into the vertically long hole 141b of the movable frame 141 and the vertically long hole 44c of the lower arm member 44 to be guided to allow its reciprocation in the vertical direction Z with respect to the movable holder 141. Additionally, the lower follower pin 44b of the lower arm member 44 is, as shown in FIG. 17, inserted into the vertically long hole 141b of the movable frame 141 and the vertically long hole 43c of the upper arm member 43 to be guided to allow its reciprocation in the vertical direction Z with respect to the movable holder 141.

Further, the extension spring 48 is hooked on the upper follower pin 43b and the lower follower pin 44b so as to attract these pins toward each other. As a result, the upper follower pin 43b maintains a state that it is engaged with the upper cam portion 142b and receives a cam function of the vertical movement, and the lower follower pin 44b maintains a state that it is engaged with the lower cam portion 142c and receives the cam function of the vertical movement.

That is, in the relationship among the movable holder 141, the cam member 142, the upper arm member 43 and the lower arm member 44, the upper cam portion 142b and the lower cam portion 142c exercise the cam function so as to relatively vertically move the upper arm member 43 and the lower arm member 44.

As shown in FIG. 19, when the upper follower pin 43b and the lower follower pin 44b move from the point A toward the point D (i.e., when the movable holder 141 moves toward the right-hand side in a state that the other side portion 142e of the cam member 142 is in contact with the second stopper 47), a grasping operation and a pull-out operation, a releasing operation, and a retracting operation are continuously carried out in the mentioned order.

On the other hand, when the upper follower pin 43b and the lower follower pin 44b move from the point D toward the point A (i.e., when the movable holder 141 moves toward the left-hand side in a state that the one side portion 142d of the cam member 142 is in contact with the first stopper 46), an operation of moving up to the height of the carrying surface S from a standby state at a retracted position, receiving an end region of the component W and grasping the component W from the vertical direction Z is completed.

Figure 20:
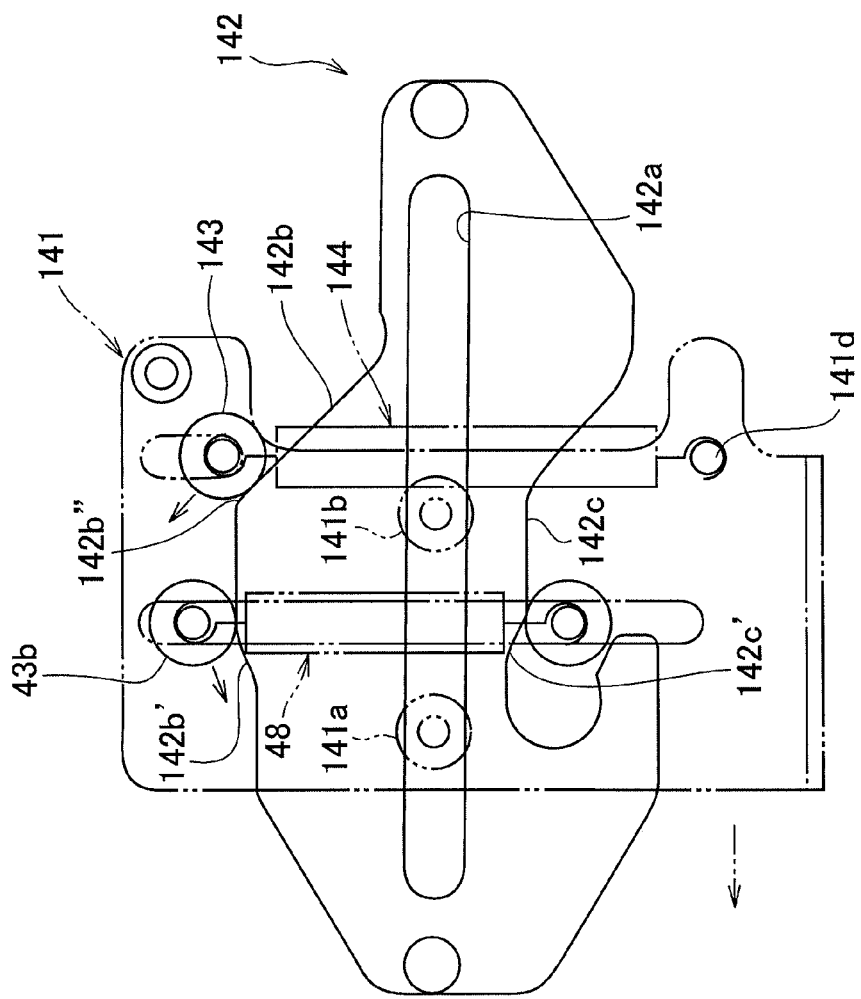
FIG. 20 is an operation view showing operations of the restraint mechanism included in the pull-out unit that forms a part of the component transfer device depicted in FIG. 17.

The two restraint follower pins 143 (one side only is illustrated) are arranged so as to correspond to two cam members 142, as shown in FIGS. 17 and 20, each of those is inserted into the vertically long hole 141c of the movable frame 141 to be guided to allow its reciprocation in the vertical direction Z in a predetermined range, and is supported by movable holder 141 so as to separably engage with the upper cam portion 142b (the inverse inclined portion 142b" and a part of the area from the pint C to the pint B in the area from the point D to the point B).

The two tension springs 144 (one side only is illustrated) are arranged so as to correspond to two restraint follower pins 143. The one end 144a of the tension spring 144 is hooked on the restraint follower pin 143 and the another end 144b of the tension spring 144 is hooked on the hook pin 141d and therefore, the tension spring 144 generates an urging force so as to make the restraint follower pin 143 engage with the upper cam portion 142b (the area including the inverse inclined portion 142b") of the cam member 142.

An operation of the restraint mechanism including the restraint follower pin 143 and the tension spring 144 will now be described with reference to FIG. 20.

When the upper arm member 43 and the lower arm member 44 move toward the point A from the point D (the movable holder 141 moves toward the left-hand side with respect to the cam member 142) by the cam function of the cam member 142 to grasp the component W, as shown in FIG. 20, the upper follower pin 43b (the lower follower pin 44b) moves on the inclined portion 142b' (142c') toward the point A from the point B, at the same time, the restraint follower pin 143 moves on the inverse inclined portion 142b" toward the point C.

In this grasping process, the inclined portion 142' (142c') and the tension spring 48 exercise a cam function and generate an urging force so as to make the upper cam member 43 and the lower cam member 44 quickly come closer to each other (make the movable holder 141 quickly move toward the left-hand side with respect to the cam member 142) to perform the grasping operation, while the inverse inclined portion 142b" and the tension spring 144 exercise a cam function and generate an urging force so as to make the movable holder 141 move toward the right-hand side with respect to the cam member 142 since the urging force of the tension spring 144 increases when the restraint follower pin 143 moves on the area of the inverse inclined portion 142b".

That is, when the upper follower pin 43b of the upper arm member 43 and the lower follower pin 44b of the lower arm member 44 move to the inclined portions 142b' and 142c' to start the grasping operation, the restraint follower pin 143 urged by the tension spring 144 engages with the inverse inclined portion 142b" formed on the upper cam portion 142b to generate a resistance force, whereby a speed when the upper follower pin 43b and the lower follower pin 44b move the inclined portion 142b' and 142c' is restrained and therefore, the upper arm member 43 and the lower arm member 44 come closer to each other gradually to grasp the component W. As a result, a shock upon grasping operation can be softened, the component W can be grasped surely.

In the foregoing embodiment, the example where the elevation unit 20 that moves up and down the rack R to be positioned is included as the holding mechanism has been described, but the present invention is not restricted thereto, and a stage that allows the component W to be positioned and held on the carrying surface located at the predetermined height by just directly mounting it thereon or an elevation table that moves up and down to position the component W on the carrying surface located at the predetermined height when directly mounting it thereon may be adopted.

Further, in the foregoing embodiment, the urging member (tension spring 144) as a restraint mechanism is adopted to restrain a rapid movement of the cam member 142 with respect to the movable holder 141, but the present invention is not restricted thereto, a contact member with a damping function can be adopted to restrain a rapid movement of the cam member 142 with respect to the movable holder 141 by coming into contact with the another side portion 142e of the cam member 142.

As described above, according to the component transfer device and method of the present invention, since a component such as a substrate accommodated in, e.g., a rack can be taken out to be smoothly transferred to a predetermined supply area and the operation efficiency and the productivity can be improved while achieving simplification of a configuration, miniaturization, a reduction in cost, and others, the device and the method can be of course utilized in a production line that mechanical components are transferred, and they are also useful in, e.g., a transfer line or a production line that components in any other field are transferred.

The invention claimed is:

1. A component transfer device comprising:
a holding mechanism for positioning and holding a component on a carrying surface located at a predetermined height; and
a pull-out unit for pulling out the component held by the holding mechanism in a horizontal direction,
wherein the pull-out unit includes a grasping member configured to separably grasp the component from an opposite direction, a cam member for exercising a cam function with respect to the grasping member to effect a grasping operation of the component and a releasing operation of the component at predetermined timings, and a driving mechanism for driving the cam member and the grasping member,
the holding mechanism includes an elevation unit for moving up and down a rack that accommodates the components on a plurality of stages,
the grasping member includes a first arm member having a first contact portion capable of separably coming into contact with one side surface of the component, and a second arm member having a second contact portion capable of separably coming into contact with another side surface of the component,
the cam member includes a guided portion that is guided reciprocatably in a pull-out direction of the component, a first cam portion that exercises the cam function with respect to the first arm member, and a second cam portion that exercises the cam function with respect to the second arm member,
the driving mechanism includes a movable holder that reciprocates in the pull-out direction, the movable holder having a horizontal guide portion for guiding the guided portion in the pull-out direction and another guide portion for guiding a first follower portion of the first arm member and a second follower portion of the second arm member in the opposite direction, and a first urging member for generating an urging force so as to make the first follower portion engage with the first cam portion and make the second follower portion engage with the second cam portion, and further comprising a restraint mechanism for restraining a relative movement of the cam member with respect to the movable holder.

2. The component transfer device according to claim 1, wherein the restraint mechanism includes a restraint follower portion separably engaging with an inverse inclined portion inversely inclined to an inclined portion corresponding a cam function range where the first arm member and the second arm member grasp the component, and a second urging member for generating an urging force so as to make the restraint follower portion engage with the inverse inclined portion.

3. The component transfer device according to claim 2, the movable holder includes a guide portion for guiding the restraint follower portion in a direction engaging with the first cam portion, and a hook portion on which a part of the second urging member is hooked.

4. The component transfer device according to claim 3, wherein the second urging member is an elastic member, one end of the elastic member being hooked on the restraint follower portion and another end of the elastic member being hooked on the hook portion.

5. The component transfer device according to claim 1, wherein the cam member exercises the cam function with respect to the grasping member to effect a retracting operation for retracting toward a lower side from the carrying surface.

6. The component transfer device according to claim 1, further comprising a carrying unit that supports and carries the component pulled out by the pull-out unit.

7. The component transfer device according to claim 1, further comprising a push-out unit that pushes out the component positioned on the carrying surface located a predetermined distance toward the grasping member side.

8. A component transfer device comprising:
a holding mechanism for positioning and holding a component on a carrying surface located at a predetermined height; and
a pull-out unit for pulling out the component held by the holding mechanism in a horizontal direction,
wherein the pull-out unit includes a grasping member configured to separably grasp the component from a vertical direction, a cam member for exercising a cam function with respect to the grasping member to effect a grasping operation of the component and a releasing operation of the component at predetermined timings, and a driving mechanism for driving the cam member and the grasping member,
the holding mechanism includes an elevation unit for moving up and down a rack that accommodates the components on a plurality of stages in the vertical direction,
the grasping member includes an upper arm member having an upper contact portion capable of separably coming into contact with an upper surface of the component, and a lower arm member having a lower contact portion capable of separably coming into contact with a lower surface of the component, the cam member includes a guided portion that is guided reciprocatably in a pull-out direction of the component, an upper cam portion that exercises the cam function of vertical movement with respect to the upper arm member, and a lower cam portion that exercises the cam function of vertical movement with respect to the lower arm member, the driving mechanism includes a movable holder that reciprocates in the pull-out direction, the movable holder having a horizontal guide portion for guiding the guided portion in a predetermined range in the pull-out direction, and a vertical guide portion for guiding an upper follower portion of the upper arm member and a lower follower portion of the second arm member in a predetermined range in the vertical direction, and a first urging member for generating an urging force so as to make the upper follower portion engage with the upper cam portion and make the lower follower portion engage with the lower cam portion, and further comprising a restraint mechanism for restraining a relative movement of the cam member with respect to the movable holder.

9. The component transfer device according to claim 8, wherein the restraint mechanism includes a restraint follower portion separably engaging with an inverse inclined portion inversely inclined to an inclined portion corresponding a cam function range where the upper arm member and the lower arm member grasp the component, and a second urging member for generating an urging force so as to make the restraint follower portion engage with the inverse inclined portion.

10. The component transfer device according to claim 9, the movable holder includes a vertical guide portion for guiding the restraint follower portion in a direction engaging with the first cam portion, and a hook portion on which a part of the second urging member is hooked.

11. The component transfer device according to claim 8, wherein the second urging member is an elastic member, one end of the elastic member being hooked on the restraint follower portion and another end of the elastic member being hooked on the hook portion.

12. The component transfer device according to claim 8, wherein the driving mechanism further includes a first stopper provided at one side where the holding mechanism is arranged and restricting a movement of the cam member alone, and a second stopper provided at another side opposite to a side where the holding mechanism is arranged and restricting a movement of the cam member alone.

13. The component transfer device according to claim 8, wherein the cam member includes a restricting portion for preventing the lower follower portion from departing from the lower cam portion in a state that the upper arm member and the lower arm member grasp the component.

* * * * *